US012685116B2

(12) United States Patent
Wu et al.

(10) Patent No.: US 12,685,116 B2
(45) Date of Patent: Jul. 14, 2026

(54) LOCAL INTERCONNECT

(71) Applicant: Taiwan Semiconductor Manufacturing Company, Ltd., Hsinchu (TW)

(72) Inventors: Cheng-Hsien Wu, Hsinchu (TW); Chung-Yi Lin, Hsinchu County (TW); Yen-Sen Wang, Hsinchu City (TW)

(73) Assignee: TAIWAN SEMICONDUCTOR MANUFACTURING CMPANY, LTD., Hsinchu (TW)

( * ) Notice: Subject to any disclaimer, the term of this patent is extended or adjusted under 35 U.S.C. 154(b) by 135 days.

(21) Appl. No.: 18/447,549

(22) Filed: Aug. 10, 2023

(65) Prior Publication Data

US 2023/0386899 A1 Nov. 30, 2023

Related U.S. Application Data

(62) Division of application No. 17/496,414, filed on Oct. 7, 2021, now Pat. No. 11,894,263.

(60) Provisional application No. 63/220,125, filed on Jul. 9, 2021.

(51) Int. Cl.

| | |
|---|---|
| ***H10W 20/00*** | (2026.01) |
| ***H10W 20/20*** | (2026.01) |
| ***H10W 20/41*** | (2026.01) |

(52) U.S. Cl.

CPC ..... *H10W 20/083* (2026.01); *H10W 20/0698* (2026.01); *H10W 20/074* (2026.01); *H10W 20/089* (2026.01); *H10W 20/20* (2026.01); *H10W 20/435* (2026.01)

(58) Field of Classification Search

CPC ......... H01L 21/76805; H01L 21/76816; H01L 21/76829; H01L 21/76895; H01L 23/5283; H01L 23/535; H01L 23/528

See application file for complete search history.

(56) References Cited

U.S. PATENT DOCUMENTS 6,448,591 B1 * 9/2002 Juengling ............. H01L 23/522 257/664
9,006,100 B2 * 4/2015 Rashed ............. H01L 21/76895 257/E21.59
2010/0252896 A1 * 10/2010 Smayling .......... H01L 21/76897 257/E27.06
2013/0005147 A1 1/2013 Angyal
2015/0047891 A1 2/2015 Lee
2016/0079175 A1 * 3/2016 Zhu ..................... H01L 23/5329 438/618
2017/0154848 A1 * 6/2017 Fan ................... H10W 20/0698
2017/0278744 A1 9/2017 Wang
2019/0088591 A1 * 3/2019 Hiremath ............ H01L 27/0207

* cited by examiner

*Primary Examiner* — Sue A Purvis
*Assistant Examiner* — Carnell Hunter, III
(74) *Attorney, Agent, or Firm* — HAYNES AND BOONE, LLP

(57) ABSTRACT

Semiconductor structures and methods are provided. A semiconductor structure according to the present disclosure includes a first metal line extending along a first direction, a second metal line lengthwise aligned with and spaced apart from the first metal line, and a third metal line extending along the first direction. The third metal line includes a branch extending along a second direction perpendicular to the first direction and the branch partially extends between the first metal line and the second metal line.

20 Claims, 22 Drawing Sheets

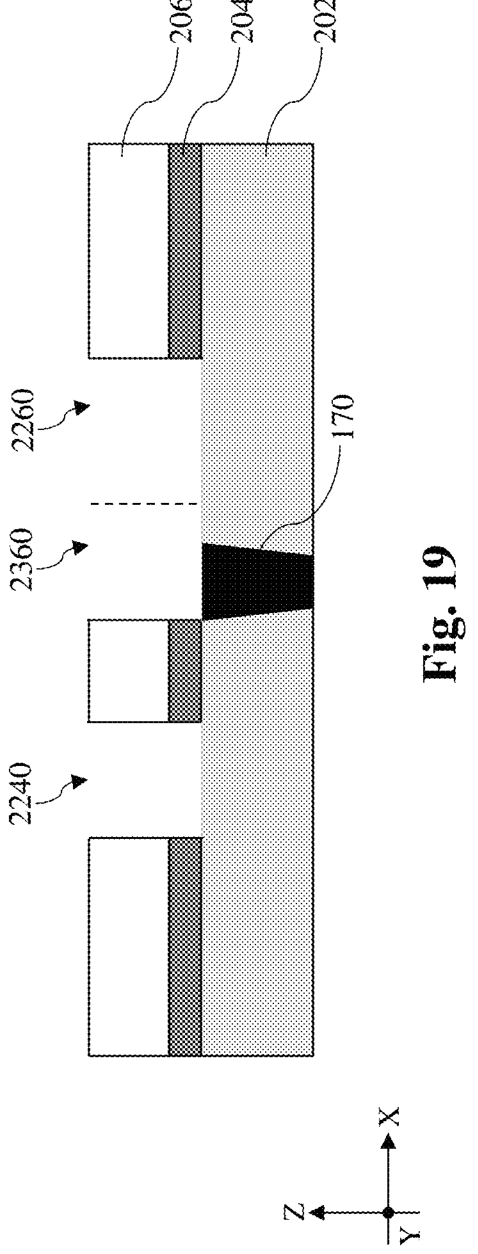
Fig. 19

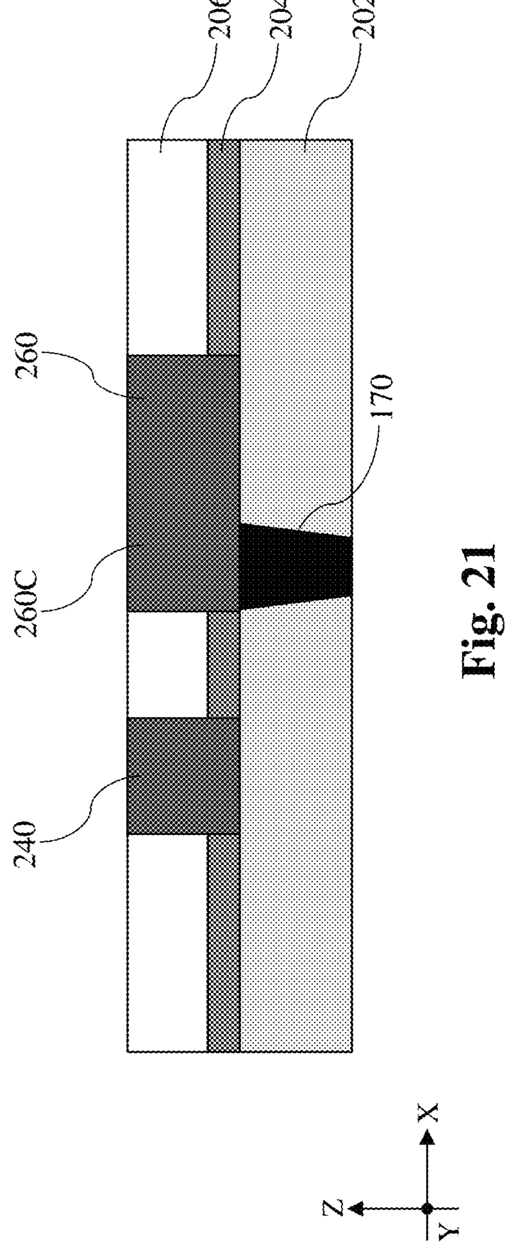
Fig. 21

LOCAL INTERCONNECT

PRIORITY DATA

The present application is a divisional application of U.S. patent application Ser. No. 17/496,414, filed Oct. 7, 2021, which claims the benefit of U.S. Provisional Application No. 63/220,125, entitled "Local Interconnect," filed Jul. 9, 2021, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Standard cell methodology is used to design IC devices with digital and/or analog features. In standard cell methodology, an IC design is encapsulated into abstract logic blocks, such as an AND, OR, NAND, NOR, XAND, or XOR gate. Each of the abstract logic blocks may be mapped to a standard cell that includes the physical design to perform the abstract logic operation. This logic-physical-bifurcation allows one designer to focus on the digital design and another designer to focus on the physical design. As the physical design of an IC is formed of standard cells, it can be seen that dimensions of the standard cells determine the dimensions of the IC. In this regard, designers in the semiconductor industry have been considering different ways to reduce a cell height of a standard cell. In recent years, configurations of the metal lines that interconnect the front-end-of-line (FEOL) devices are also going through changes in order to reduce the cell height of the standard cells. For example, the number of metal lines may undergo reduction. However, with less metal lines, it may become more difficult to form local interconnect. In some existing technologies, at least one additional photolithography mask may be needed to form a local interconnect below the first metal layer. However, an additional photolithography mask may come with process risk, fabrication cost and mask cost. While existing local interconnect structures and processes are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-22 illustrate fragmentary cross-sectional views or top views of a workpiece during a fabrication process according to the method of FIG. 1, according to one or more aspects of the present disclosure.

DETAILED DESCRIPTION

Figure 1:
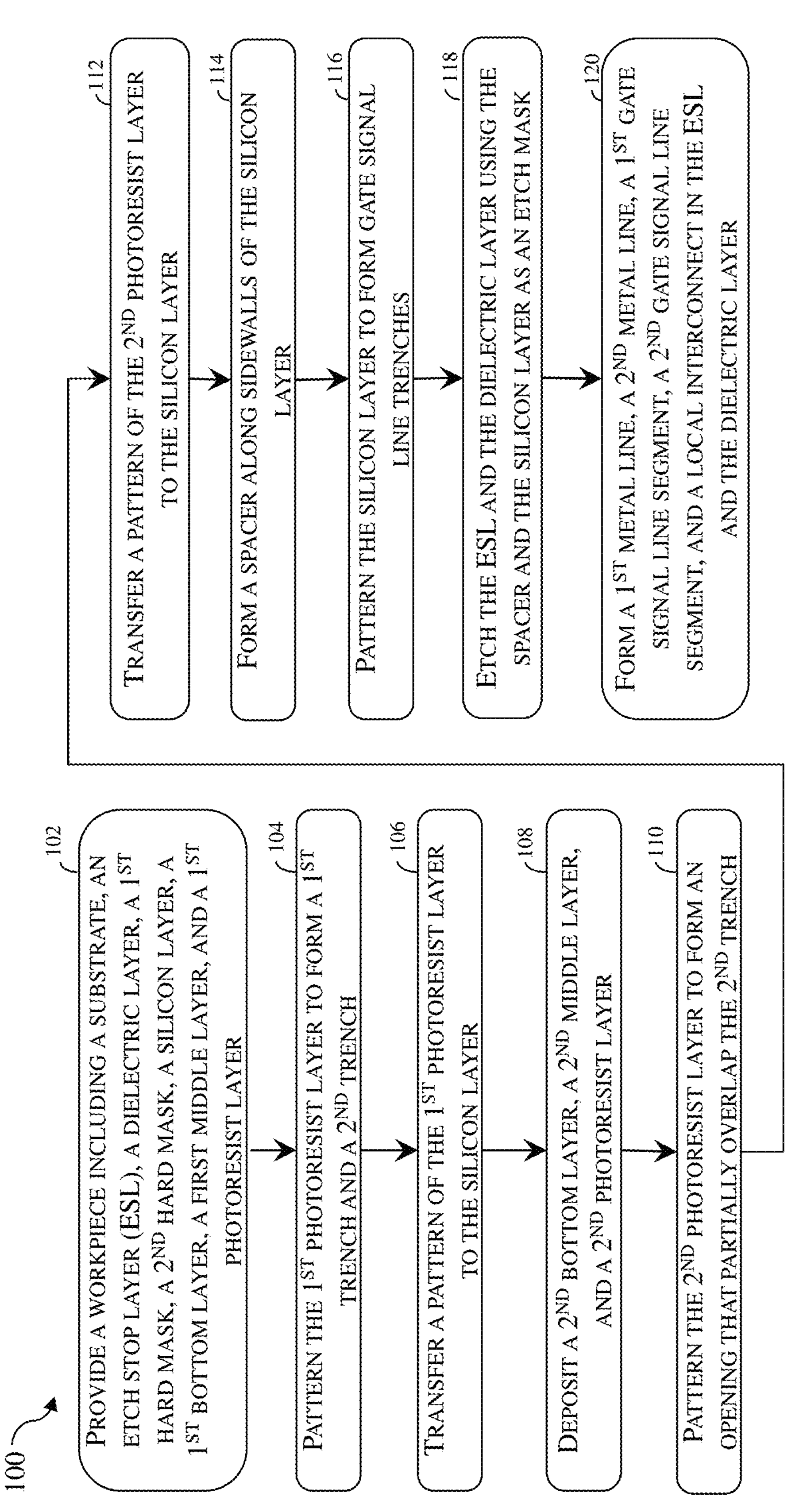
FIG. 1 illustrates a flow chart of a method for forming a semiconductor structure, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Still further, example embodiments are described herein with reference to various fragmentary cross-sectional or top-view illustrations that are schematic and/or idealized. As such, variations from the shapes of the illustration as a result of fabrication tolerances are to be expected. Unless explicitly specified herein, shapes in the illustrations may not be intended to illustrate the actual shapes and should not limit the scope of the present disclosure. Additionally, unless otherwise defined, all terms used herein have the same meanings as commonly understood by one of ordinary sill in the art to which the example embodiments belong.

Standard cell methodology is used to design IC devices with digital and/or analog features. In standard cell methodology, an IC design is encapsulated into abstract logic blocks, such as an AND, OR, NAND, NOR, XAND, or XOR gate. Each of the abstract logic blocks may be mapped to a standard cell that includes the physical design to perform the abstract logic operation. This logic-physical-bifurcation allows one designer to focus on the digital design and another designer to focus on the physical design. As the physical design of an IC is formed of standard cells, it can be seen that dimensions of the standard cells determine the dimensions of the IC. In this regard, designers in the semiconductor industry have been considering different ways to reduce a cell height of a standard cell. In recent years, configurations of the metal lines that interconnect the front-end-of-line (FEOL) devices are also going through changes in order to reduce the cell height of the standard cells. For example, the number of metal lines may undergo reduction. However, with less metal lines, it may become more difficult to form local interconnect. In some existing technologies, at least one additional photolithography mask may be needed to form a local interconnect below the first metal layer. However, an additional photolithography mask may come with process risk, fabrication cost and mask cost. When the extreme ultraviolet (EUV) photolithography is used, additional photolithography masks and processes may include the cost substantially.

The present disclosure provides a method to form metal lines in the first metal layer over the front-end-of-line structures, such as fin type field effect transistors (finFETs) or multi-bridge-channel (MBC) transistors. The metal lines extend parallel to one another along a first direction. According to the present disclosure, the first metal layer includes a first metal line disposed directly over a first source/drain contact via, a second metal line disposed directly over a second source/drain contact via, and a gate signal line disposed between the first metal line and the second metal line. The gate signal line is separated into a first segment and a second segment. The second metal line includes a branch portion that extends from the second metal line along a second direction perpendicular to the first direction. The branch portion extends between the first segment and the second segment but does not reach the first metal line. The branch portion extends over a gate contact via such that the second metal line serves as a local interconnect to electrically connect the gate contact via and the second source/drain contact via. The second metal line and the branch portion of the present disclosure serve not only as a metal line but also as a local interconnect to electrically couple a gate to a source/drain.

The various aspects of the present disclosure will now be described in more detail with reference to the figures. In that regard, FIG. 1 is a flowchart illustrating a method 100 of forming a semiconductor structure according to embodiments of the present disclosure. Method 100 is merely an example and is not intended to limit the present disclosure to what is explicitly illustrated in method 100. Additional steps may be provided before, during and after method 100, and some steps described can be replaced, eliminated, or moved around for additional embodiments of the method. Not all steps are described herein in detail for reasons of simplicity. Method 100 is described below in conjunction with FIGS. 2-22, which are fragmentary cross-sectional views or top views of a workpiece 200 at different stages of fabrication according to method 100. Because the workpiece 200 will be fabricated into a semiconductor device or a semiconductor structure upon conclusion of the fabrication processes, the workpiece 200 may also be referred to as the semiconductor device 200 or a semiconductor structure 200 as the context requires. Additionally, throughout the present application, like reference numerals denote like features, unless otherwise excepted.

Figure 2:
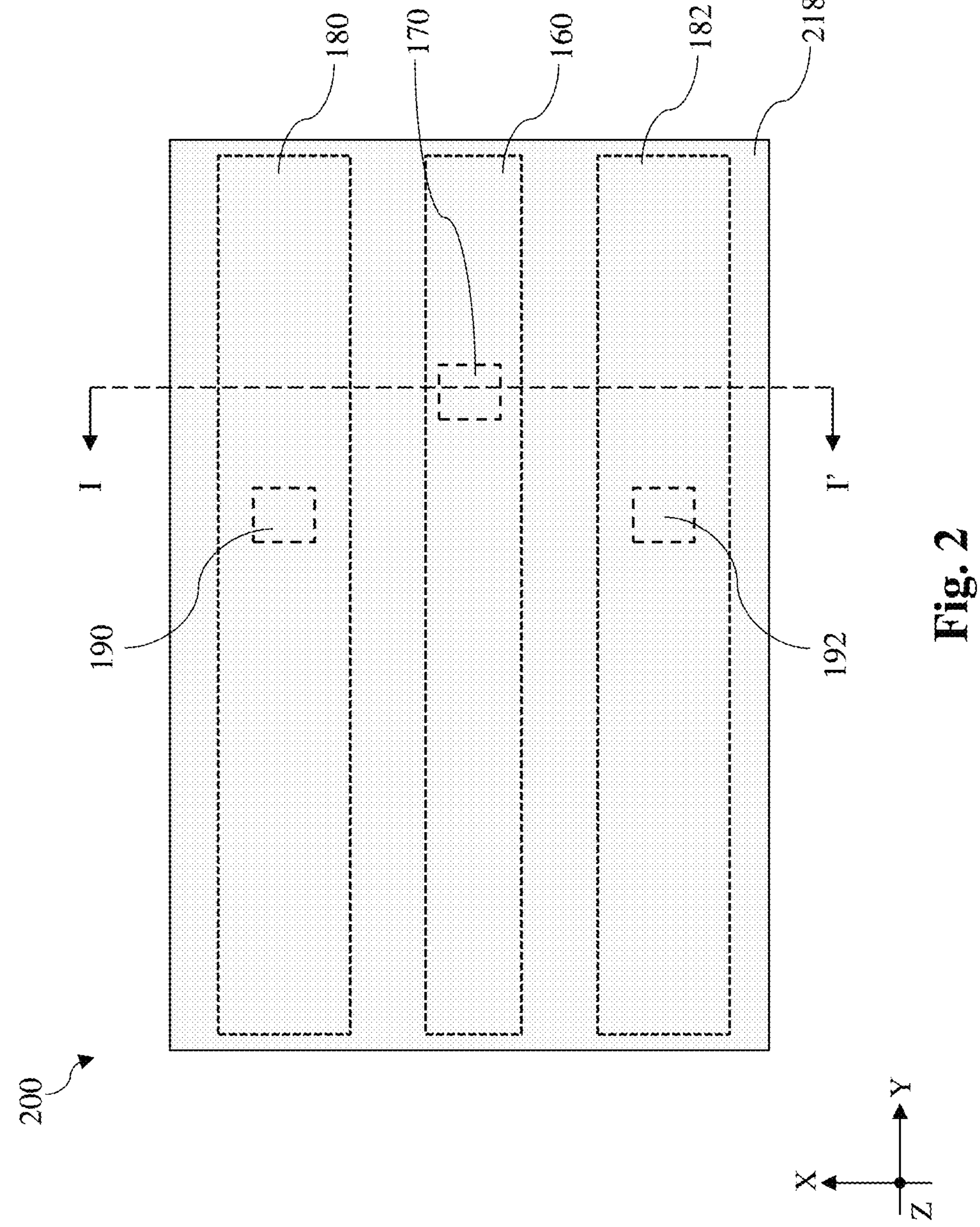
Figure 3:
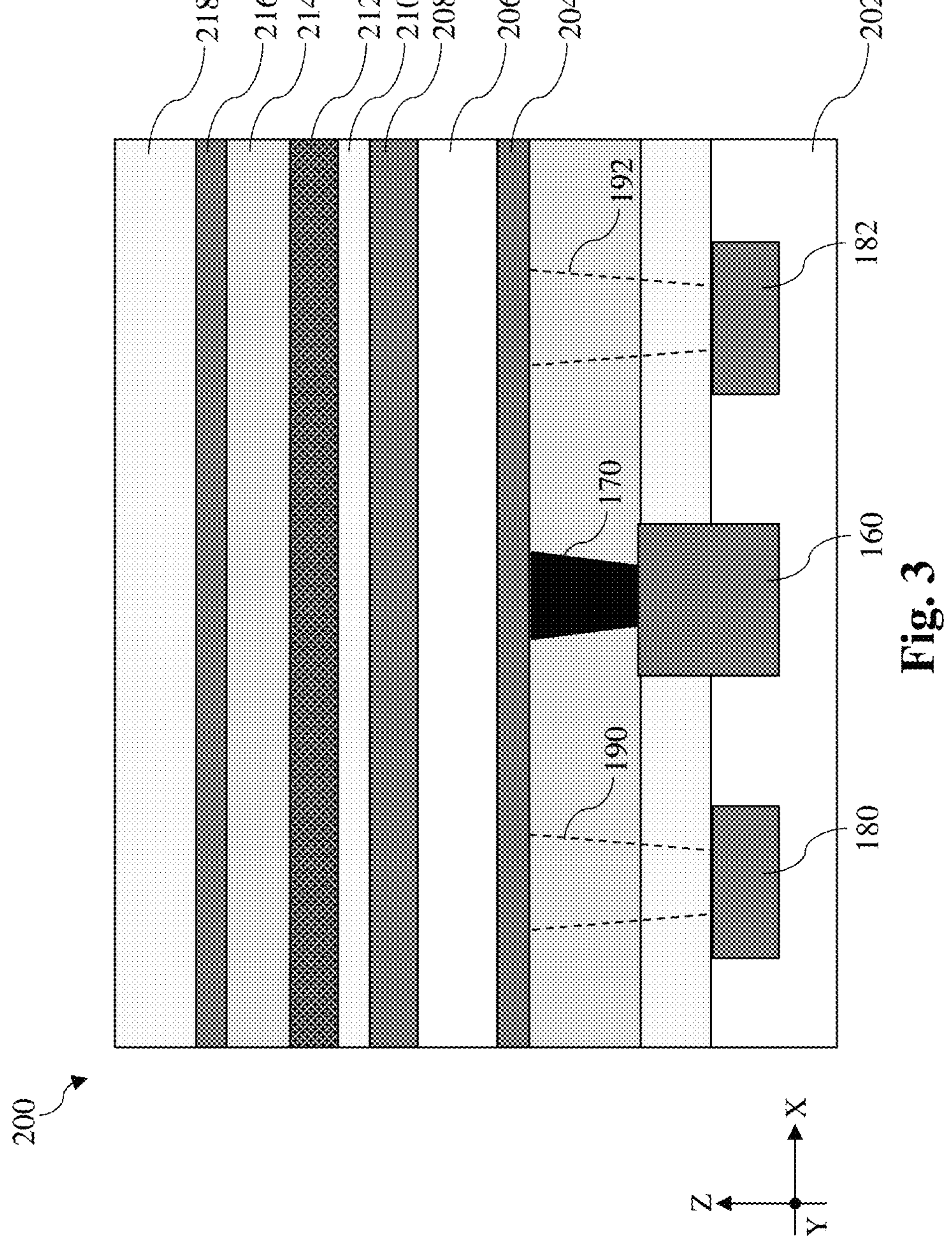

Referring to FIGS. 1, 2 and 3, method 100 includes a block 102 where a workpiece 200 is provided. FIG. 2 includes a fragmentary top view of the workpiece 200 while FIG. 3 illustrates a fragmentary cross-sectional view of the workpiece 200 in FIG. 2 along section I-I'. As shown in FIGS. 2 and 3, the workpiece 200 includes a substrate 202, a gate structure 160, a first source/drain contact 180, a second source/drain contact 182, a first source/drain contact via 190 disposed on and in contact with the first source/drain contact 180, a second source/drain contact via 192 disposed on and in contact with the second source/drain contact 182, and a gate contact via 170. Although not explicitly shown in FIG. 3, the workpiece 200 includes a plurality of active regions that are fin-shaped or come in stacks of nanostructures. When the active regions are fin-shaped, the workpiece 200 includes fin-type field effect transistors (finFETs). When the active regions include stacks of nanostructures, the workpiece 200 includes multi-bridge-fin (MBC) transistors. MBC transistors may also be referred to as gate-all-around (GAA) transistors, nanowire transistors, nanosheet transistors, or surrounding-gate transistors (SGTs), depending on the configurations. An active region includes channel regions and source/drain regions. The gate structure 160 is disposed over the channel region. In the case of an MBC transistors, the gate structure 160 wraps around each of the nanostructures. Source/drain features (not explicitly shown in the figures) are formed over the source/drain regions. Source/drain contacts, such as the first source/drain contact 180 and the second source/drain contact 182 are disposed over and in contact with the source/drain features. The first source/drain contact via 190, the second source/drain contact via 192, and the gate contact via 170 extend through one or more interlayer dielectric (ILD) layers to come in contact with the first source/drain contact 180, the second source/drain contact 182, and the gate structure 160, respectively. For simplicity, the first source/drain contact 180, the second source/drain contact 182, and the gate structure 160 may not be illustrated in every figure.

The source/drain features may include silicon (Si) doped with an n-type dopant (e.g. phosphorus (P) or arsenic (As) or silicon germanium (SiGe) doped with a p-type dopant (e.g. boron (B) or boron difluoride ($BF_2$)). The first source/drain contact 180 and the second source/drain contact 182 may include cobalt (Co), ruthenium (Ru), tungsten (W), copper (Cu), nickel (Ni), a combination thereof, or another suitable metal. In some implementations, each of the first source/drain contact 180 and the second source/drain contact 182 includes a barrier layer, which may include titanium nitride or tantalum nitride. The gate structure 160 includes an interfacial layer, a gate dielectric layer over the interfacial layer, and a gate electrode layer over the gate dielectric layer. The interfacial layer includes silicon oxide and may be formed in a pre-clean process. The gate dielectric layer may include a high-k dielectric material having a dielectric constant greater than that of silicon dioxide, which is about 3.9. In some embodiments, the gate dielectric layer may include titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The gate electrode layer may include multiple layer, such as various combinations of a metal layer with a selected work function to enhance the device performance (work function metal layer), a liner layer, a glue layer, a blocking layer, a metal fill. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

Each of the first source/drain contact via 190, the second source/drain contact via 192, and the gate contact 170 may include cobalt (Co), ruthenium (Ru), tungsten (W), copper (Cu), nickel (Ni), a combination thereof, or another suitable metal. Each of the first source/drain contact via 190, the second source/drain contact via 192, and the gate contact 170 may include a barrier layer to prevent oxygen diffusion from neighboring dielectric layers. The barrier layer may include titanium nitride or tantalum nitride. Each of the first source/drain contact via 190 and the second source/drain contact via 192 may be in electrical communication with the underlying source/drain feature by way of a silicide layer (not explicitly shown). The silicide layer reduces contact resistance and may include nickel silicide, cobalt silicide, titanium silicide, or other suitable metal silicide. As shown in FIG. 2, the first source/drain contact via 190, the second source/drain contact via 192 and the gate contact via 170 are not aligned along the X direction to increase the spacing between the first source/drain contact via 190 and the gate contact via 170 and between the second source/drain contact via 192 and the gate contact via 170. The increased spacing reduces the gate-source or gate-drain capacitance.

Over the substrate 202, the workpiece 200 further includes an etch stop layer (ESL) 204, a dielectric layer 206 over the ESL 204, a first hard mask layer 208, a second hard mask layer 210, a silicon layer 212, a first bottom layer 214 over the silicon layer 212, a first bottom layer 214, a first middle layer 216, and a first photoresist layer 218. The substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure. The ESL 204 may include silicon nitride or silicon oxynitride and may be deposited using chemical vapor deposition (CVD), high density plasma CVD (HDPCVD), or plasma enhanced CVD (PECVD). The dielectric layer 206 may include silicon oxide, fluorine-doped silicate glass (FSG), a low-k dielectric, combinations thereof, and/or other suitable materials and may be formed using CVD, flowable CVD (FCVD), spin-on coating, and/or other suitable process. The first hard mask layer 208 may include silicon oxide, tungsten carbide, metal oxide, or a material that may be selectively etched in the presence of silicon or silicon nitride. The first hard mask layer 208 may be formed using CVD, HDPCVD, or PECVD. The second hard mask layer 210 may include silicon nitride and may be formed using CVD, HDPCVD or PECVD. The silicon layer 212 may include amorphous silicon (a-Si) and may be formed using CVD.

In some embodiments, the first bottom layer 214 may be a carbon-containing layer and may include silicon carbide (SiC), silicon oxycarbide (SiOC), or spin-on carbon (SOC). The first middle layer 216 may be silicon-containing layer and may include silicon oxide silicon oxynitride, silicon nitride, or spin-on-glass (SOG). The first middle layer 216 may be a bottom anti-reflective coating (BARC) layer which is used to reduce reflection during the photolithography process. The first photoresist layer 218 may also be referred to as a first top layer 218. The first photoresist layer 218 may include a polymeric material, such as poly(methyl methacrylate) (PMMA), polymethylglutarimide (PMGI), phenol formaldehyde resin, or other suitable materials. The first bottom layer 214, the first middle layer 216, and the first photoresist layer 218 may be deposited over the workpiece 200 using spin-on coating, FCVD, or CVD.

Figure 4:
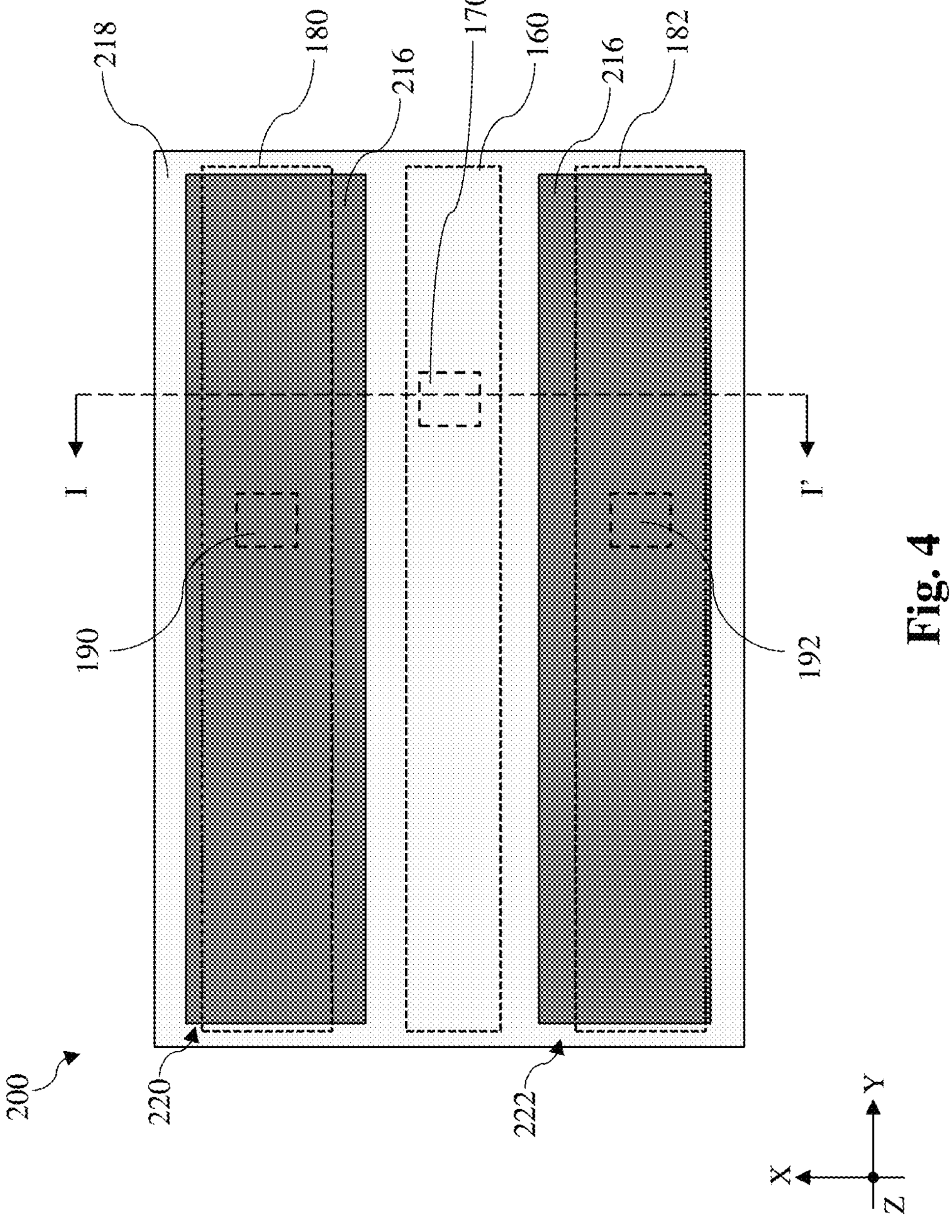
Figure 5:
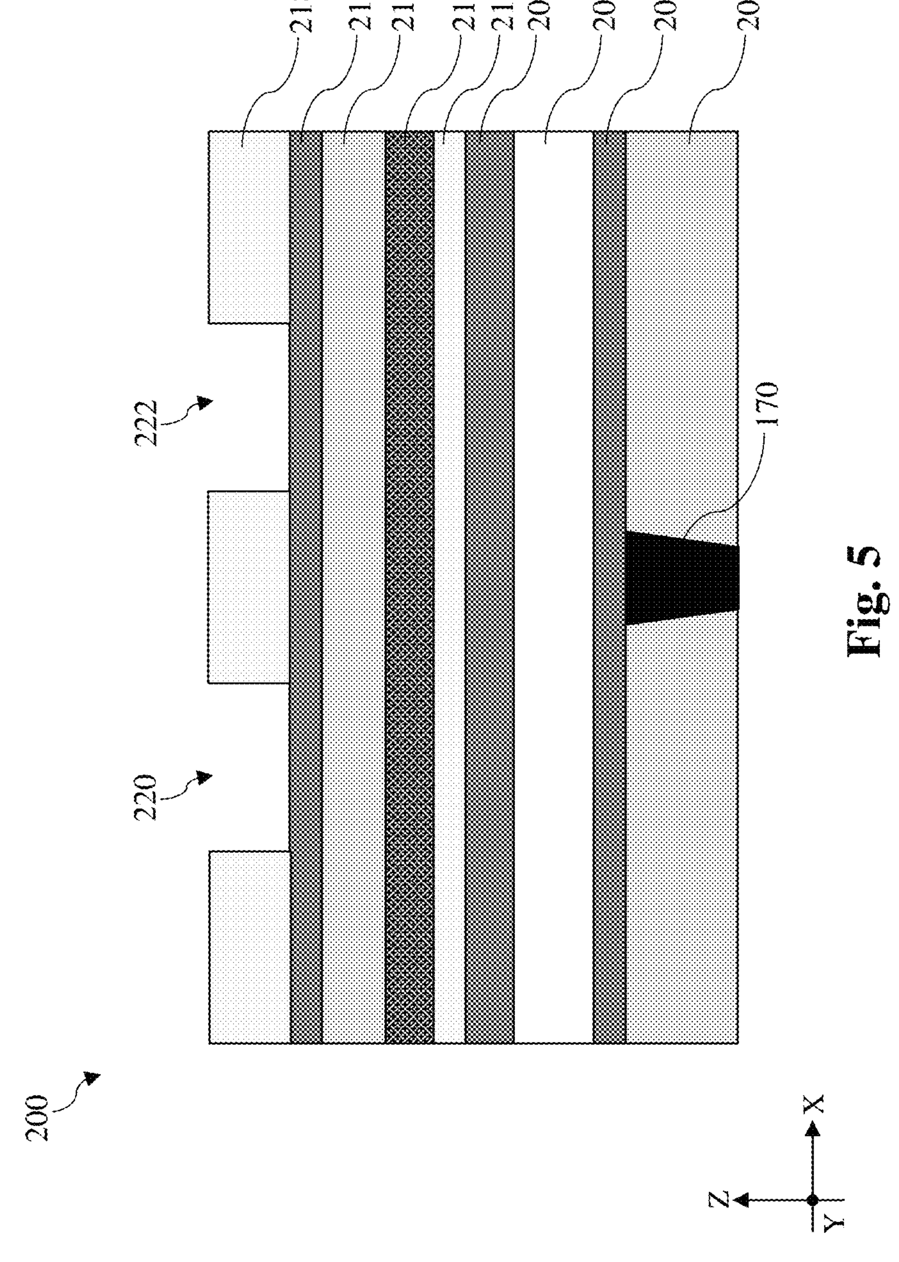

Referring to FIGS. 1, 4 and 5, method 100 includes a block 104 where the first photoresist layer 218 is patterned to form a first trench 220 and a second trench 222. FIG. 4 includes a fragmentary top view of the workpiece 200 while FIG. 5 illustrates a fragmentary cross-sectional view of the workpiece 200 in FIG. 4 along section I-I'. In an example process, the first photoresist layer 218 is exposed to a unidirectional patterned radiation (along the X direction) reflected from or transmitting through a photomask, developed in a developer solution, and baked in a bake process, so as to form a patterned first photoresist layer 218. As shown in FIGS. 4 and 5, the patterned first photoresist layer 218 includes a first trench 220 and a second trench 222. The first trench 220 is elongated and extends along the Y direction. The first trench 220 is disposed directly over the first source/drain contact 180, including over the first source/drain contact via 190. The second trench 222 is elongated and extends along the Y direction. The second trench 222 is disposed directly over the second source/drain contact 182, including over the second source/drain contact via 192.

Figure 6:
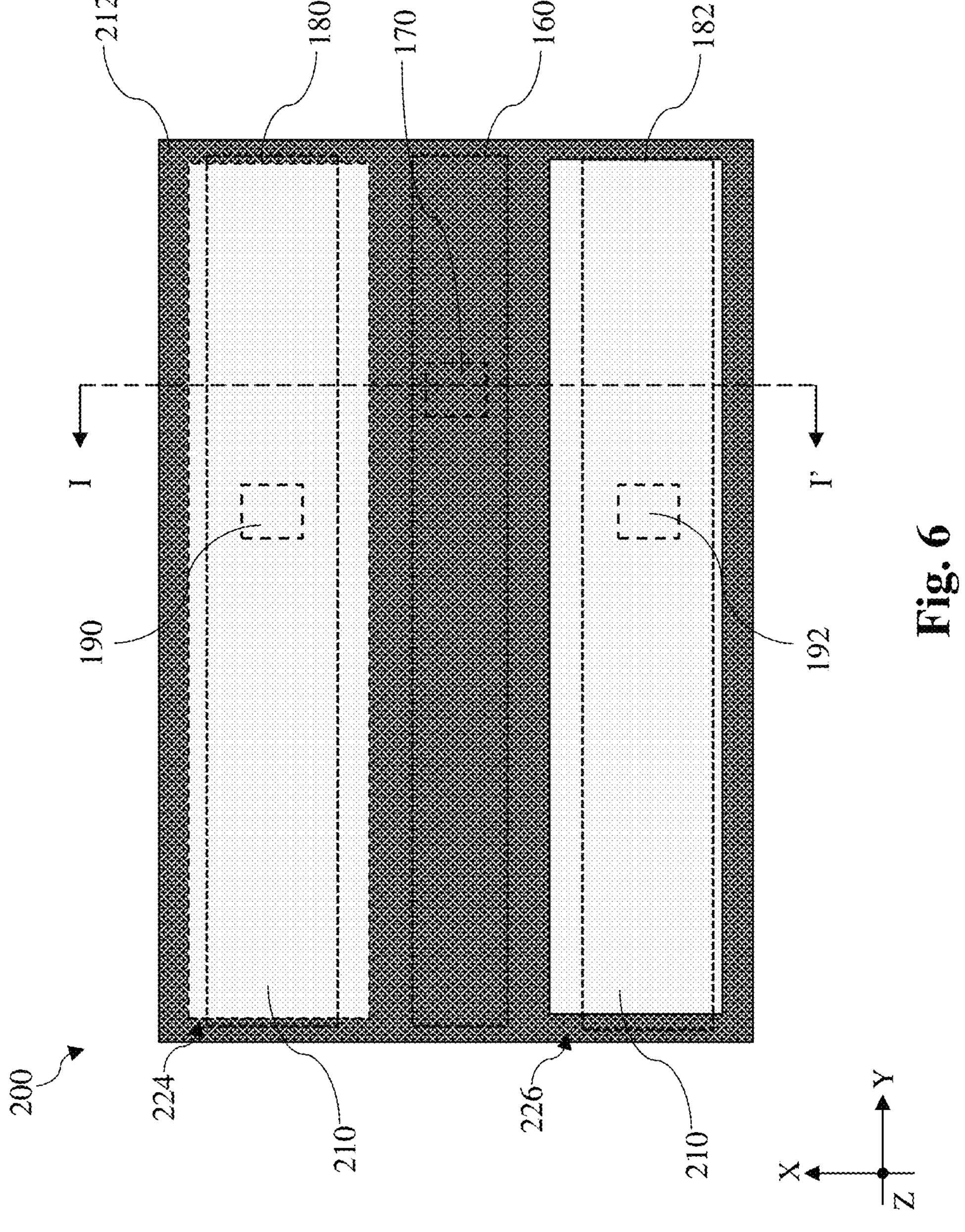
Figure 7:
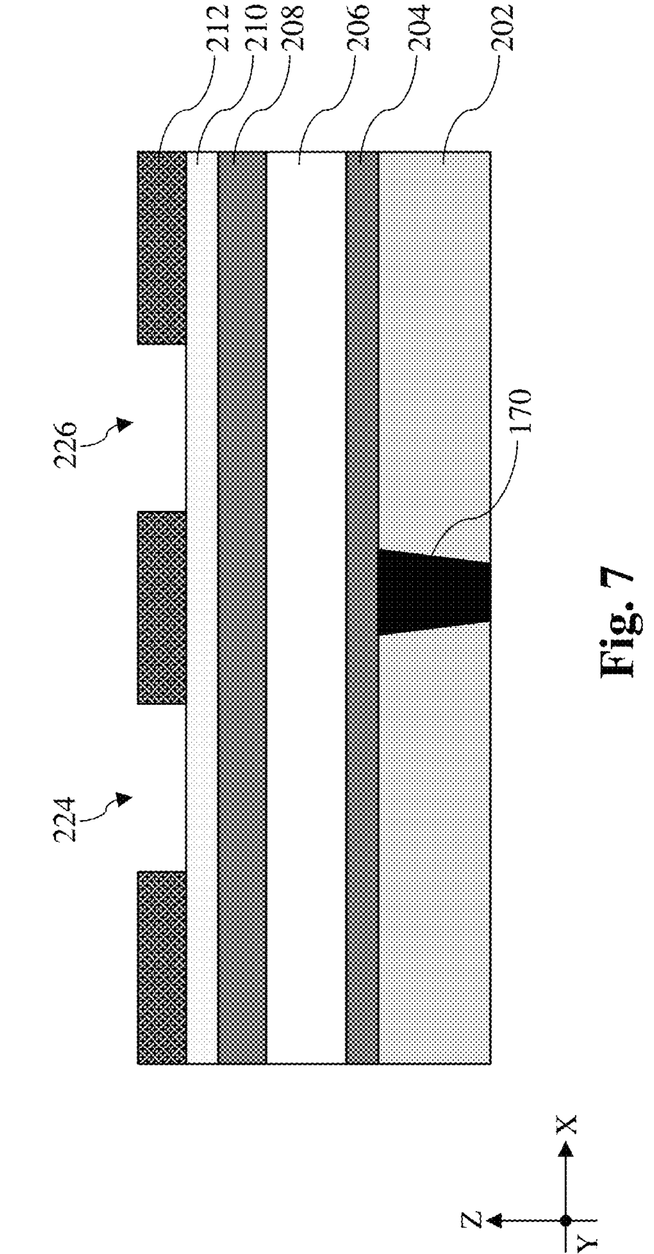

Referring to FIGS. 1, 6 and 7, method 100 includes a block 106 where a pattern of the first photoresist layer 218 is transferred to the silicon layer 212. FIG. 6 includes a fragmentary top view of the workpiece 200 while FIG. 7 illustrates a fragmentary cross-sectional view of the workpiece 200 in FIG. 6 along section I-I'. Referring now to FIG. 6, the patterned first photoresist layer 218 may then be used as an etch mask in a dry etch process to pattern the first middle layer 216, the first bottom layer 214, and the silicon layer 212, thereby transferring the pattern of the patterned first photoresist layer 218 to the silicon layer 212. An example dry etch process at block 106 may be a reactive-ion-etching (RIE) process that uses nitrogen, a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 6, the patterned silicon layer 212 exposes the second hard mask layer 210 underlying the silicon layer. After the pattern transfer, the first trench 220 in the patterned first photoresist layer 218 is transferred to the silicon layer 212 as the third trench 224 and the second trench 222 in the patterned first photoresist layer 218 is transferred to the silicon layer 212 as the fourth trench 226. That is, the first trench 220 vertically corresponds to the third trench 224 and the second trench 222 vertically corresponds to the fourth trench 226. The third trench 224 is elongated and extends along the Y direction. The third trench 224 is disposed directly over the first source/drain contact 180, including over the first source/drain contact via 190. The fourth trench 226 is elongated and extends along the Y direction. The fourth trench 226 is disposed directly over the second source/drain contact via 192, including over the second source/drain contact via 192.

Figure 8:
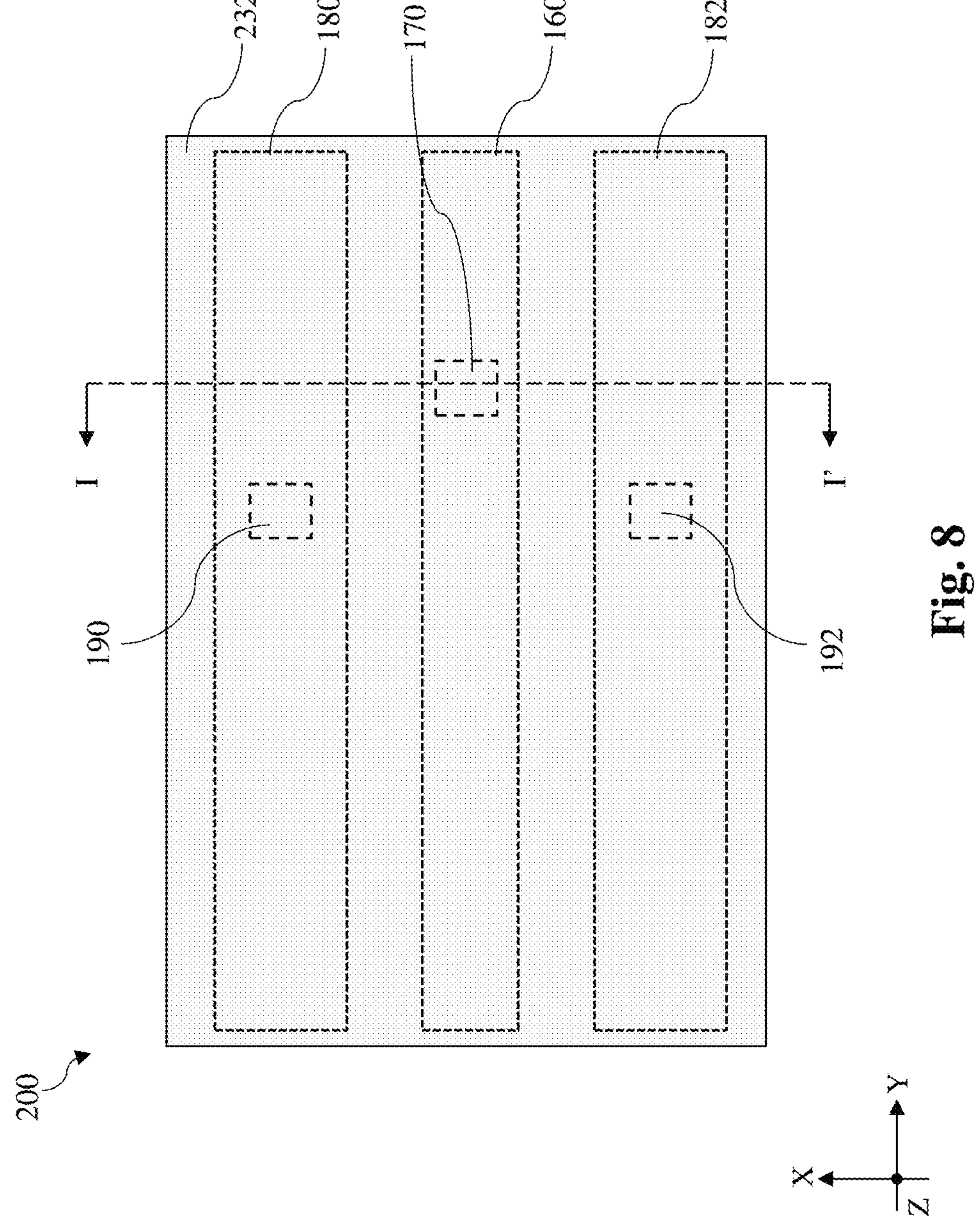
Figure 9:
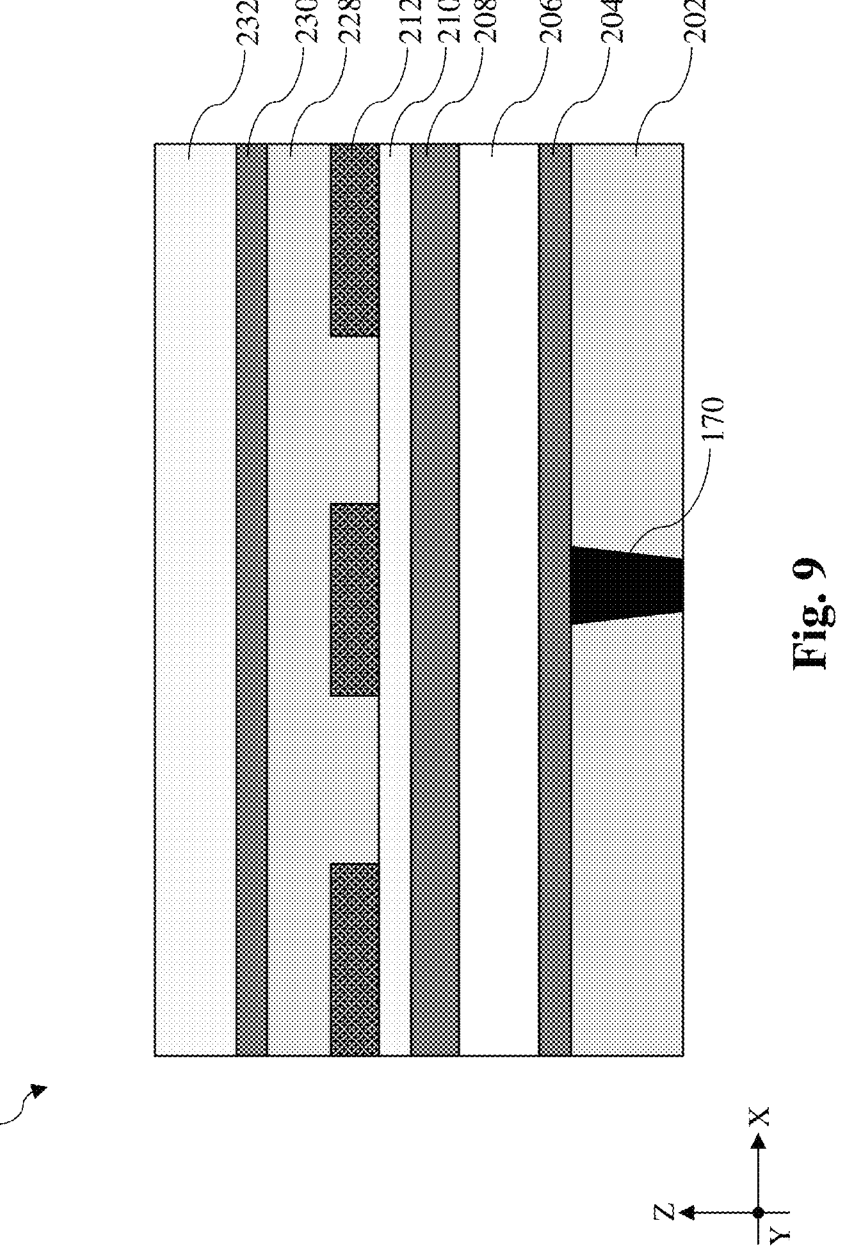

Referring to FIGS. 1, 8 and 9, method 100 includes a block 108 where a second bottom layer 228, a second middle layer 230, and a second photoresist layer 232 are sequentially deposited over the workpiece 200. FIG. 8 includes a fragmentary top view of the workpiece 200 while FIG. 9 illustrates a fragmentary cross-sectional view of the workpiece 200 in FIG. 8 along section I-I'. At block 108, the second bottom layer 228, the second middle layer 230, and the second photoresist layer 232 are sequentially deposited the silicon layer 212 patterned at block 106. The second bottom layer 228, the second middle layer 230, and the second photoresist layer 232 may be similar to the first bottom layer 214, the first middle layer 216, and the first photoresist layer 218, respectively, in terms of composition and formation processes. In some embodiments, the second bottom layer 228 may be a carbon-containing layer and may include silicon carbide (SiC), silicon oxycarbide (SiOC), or spin-on carbon (SOC). The second middle layer 230 may be silicon-containing layer and may include silicon oxide silicon oxynitride, silicon nitride, or spin-on-glass (SOG). The second middle layer 230 may be a bottom anti-reflective coating (BARC) layer which is used to reduce reflection during the photolithography process. The second photoresist layer 232 may also be referred to as a second top layer 232. The second photoresist layer 232 may include a polymeric material, such as poly(methyl methacrylate) (PMMA), polymethylglutarimide (PMGI), phenol formaldehyde resin, or other suitable materials. The second bottom layer 228, the second middle layer 230, and the second photoresist layer 232 may be deposited over the workpiece 200 using spin-on coating, FCVD, or CVD.

Figure 10:
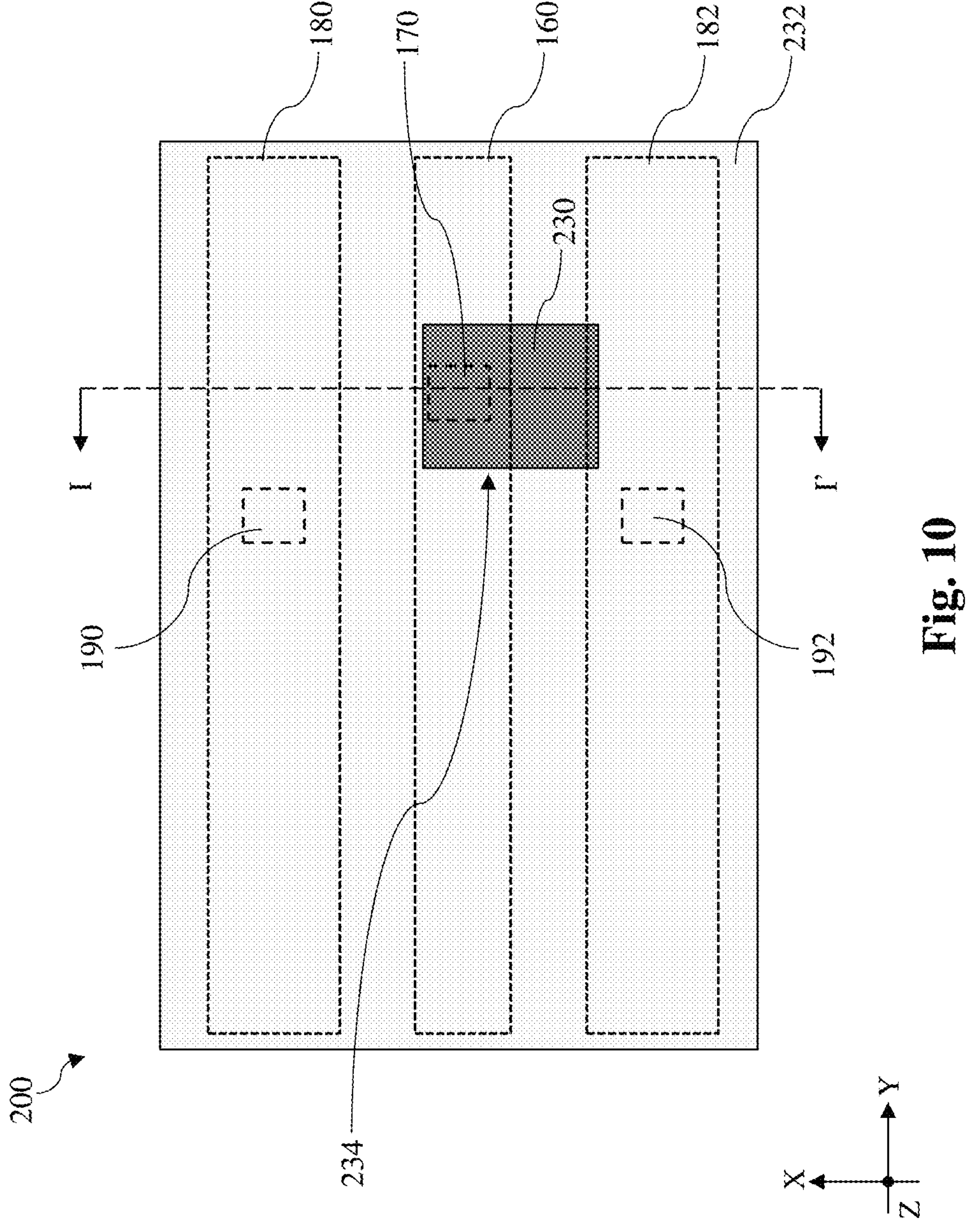
Figure 11:
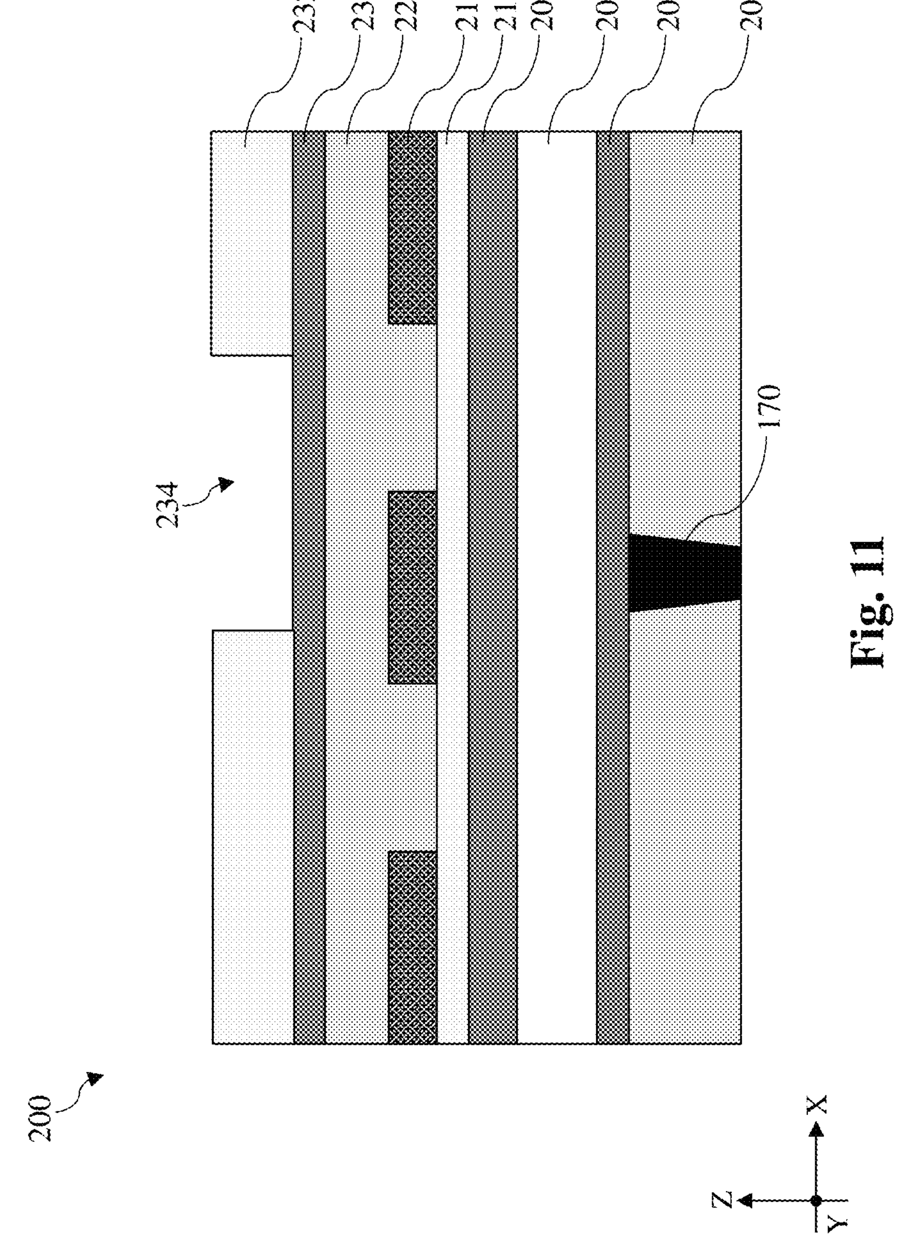

Referring to FIGS. 1, 10 and 11, method 100 includes a block 110 where the second photoresist layer 232 is patterned to form an opening 234 that partially overlaps the second trench 222. FIG. 10 includes a fragmentary top view of the workpiece 200 while FIG. 11 illustrates a fragmentary cross-sectional view of the workpiece 200 in FIG. 10 along section I-I'. In an example process, the second photoresist layer 232 is exposed to a unidirectional patterned radiation (along the X direction) reflected from or transmitting through a photomask, developed in a developer solution, and baked in a bake process, so as to form a patterned second photoresist layer 232. As shown in FIGS. 10 and 11, the patterned second photoresist layer 232 includes the opening 234. The opening 234 may be substantially rectangular and is disposed directly over at least a portion of the gate structure 160 and a portion of the gate contact via 170.

Figure 12:
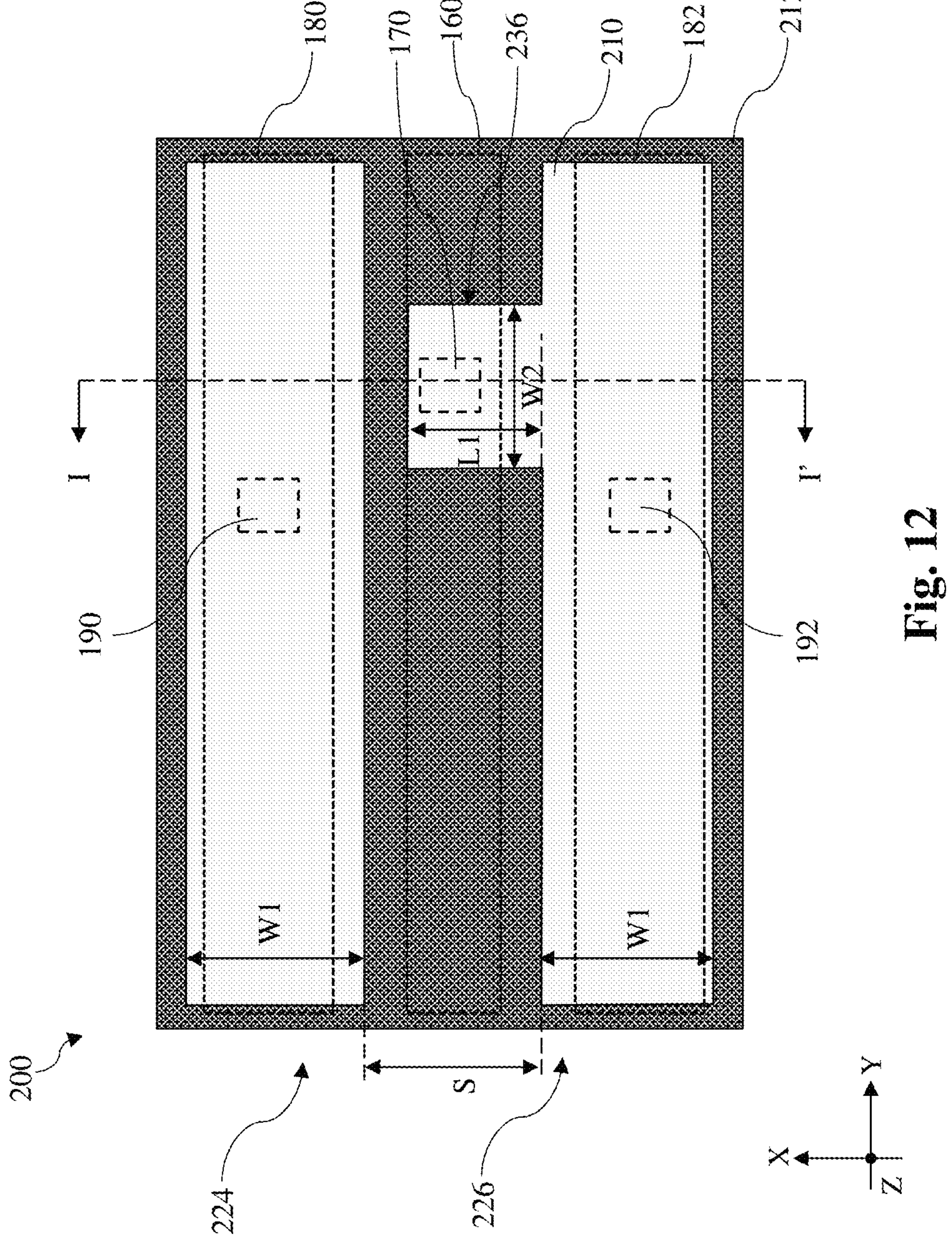
Figure 13:
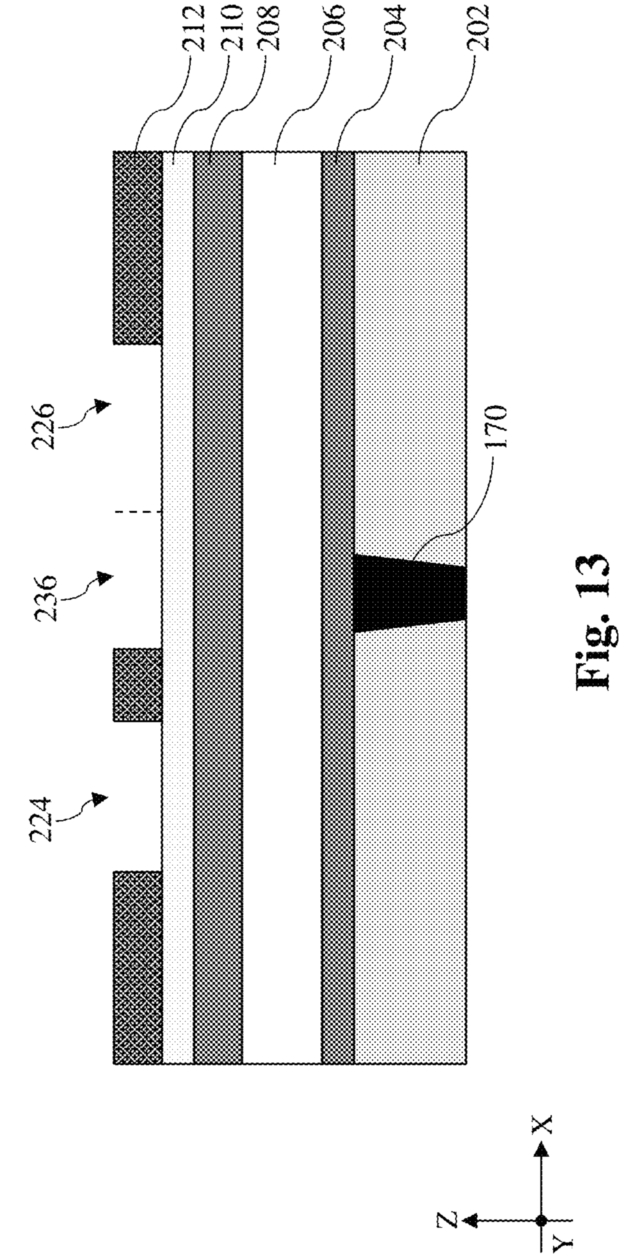

Referring to FIGS. 1, 12 and 13, method 100 includes a block 112 where a pattern of the second photoresist layer 232 is transferred to the silicon layer 212. FIG. 12 includes a fragmentary top view of the workpiece 200 while FIG. 13 illustrates a fragmentary cross-sectional view of the workpiece 200 in FIG. 12 along section I-I'. Referring now to FIG. 12, the patterned second photoresist layer 232 may then be used as an etch mask in a dry etch process to pattern the second middle layer 230, the second bottom layer 228, and the silicon layer 212, thereby transferring the pattern of the patterned second photoresist layer 232 to the silicon layer 212. An example dry etch process at block 112 may be a reactive-ion-etching (RIE) process that uses nitrogen, a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 12, the patterned silicon layer 212 exposes the second hard mask layer 210. After the pattern transfer, the opening 234 in the patterned second photoresist layer 232 is transferred to the silicon layer 212 as a branch opening 236 that extends from the fourth trench 226 along the X direction. As a result, the branch opening 236 extends over the gate structure 160 and the gate contact via 170. As illustrated in FIGS. 12 and 13, the branch opening 236 merges with the fourth trench 226 such that they are in fluid communication with one another. As measured along the X direction, each of the third trench 224 and the fourth trench 226 has a first width W1. In some instances, the first width W1 is between about 25 nm and about 50 nm. The branch opening 236 has a second width W2 measured along the Y direction and a first length L1 measured along the X direction. In some instances, the second width W2 is between about 25 nm and about 50 nm. The third trench 224 and the fourth trench 226 are spaced apart by a spacing S. In some instances, the spacing S may be between about 15 nm and about 30 nm. In some embodiments, a ratio of the spacing S to the first length L1 may be between about 1.2 and about 1.6. The ratio is not trivial. When the ratio is below 1.2, the branch opening 236 may be too close to the third trench 224 to reduce the process window and yield. Put differently, in these embodiments, the first length L1 may be between about 0.625 and about 0.83 of the spacing S. When the ratio is over 1.6, the branch opening 236 may not sufficiently overlap the gate contact via 170 and the resulting electrical connection with the gate contact via 170 may be poor. The range of the second width W2 is also not trivial. When the second width W2 is smaller than 25 nm, the spacer 238 (to be described below) in the branch opening 236 may merge to completely fill up the branch opening 236. That will lead to a failed connection to the gate contact via 170. When the second width W2 is greater than 50 nm, the branch opening 236 may become too close to another gate contact via, leading to shorts or undesirable capacitance.

Figure 14:
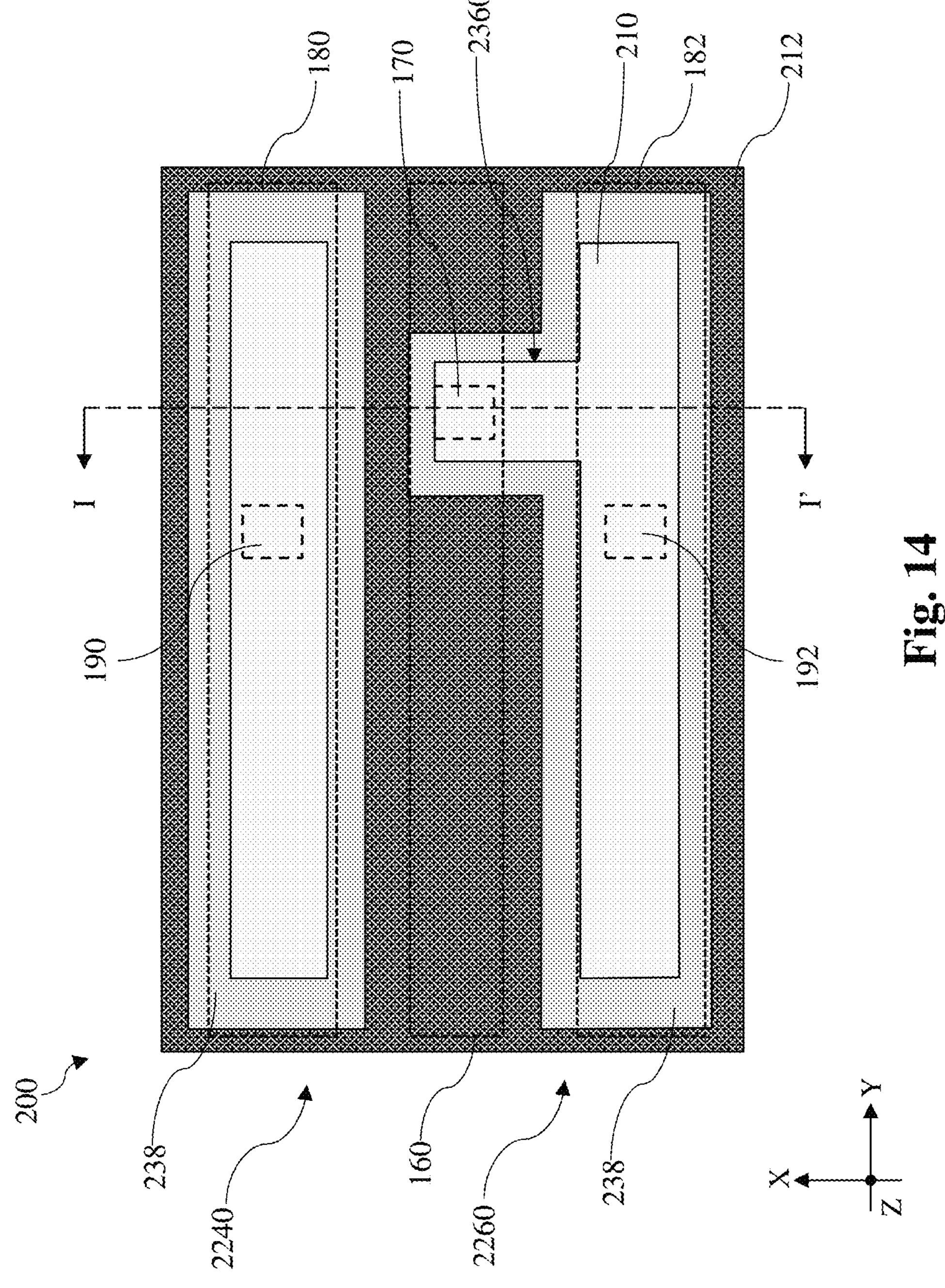
Figure 15:
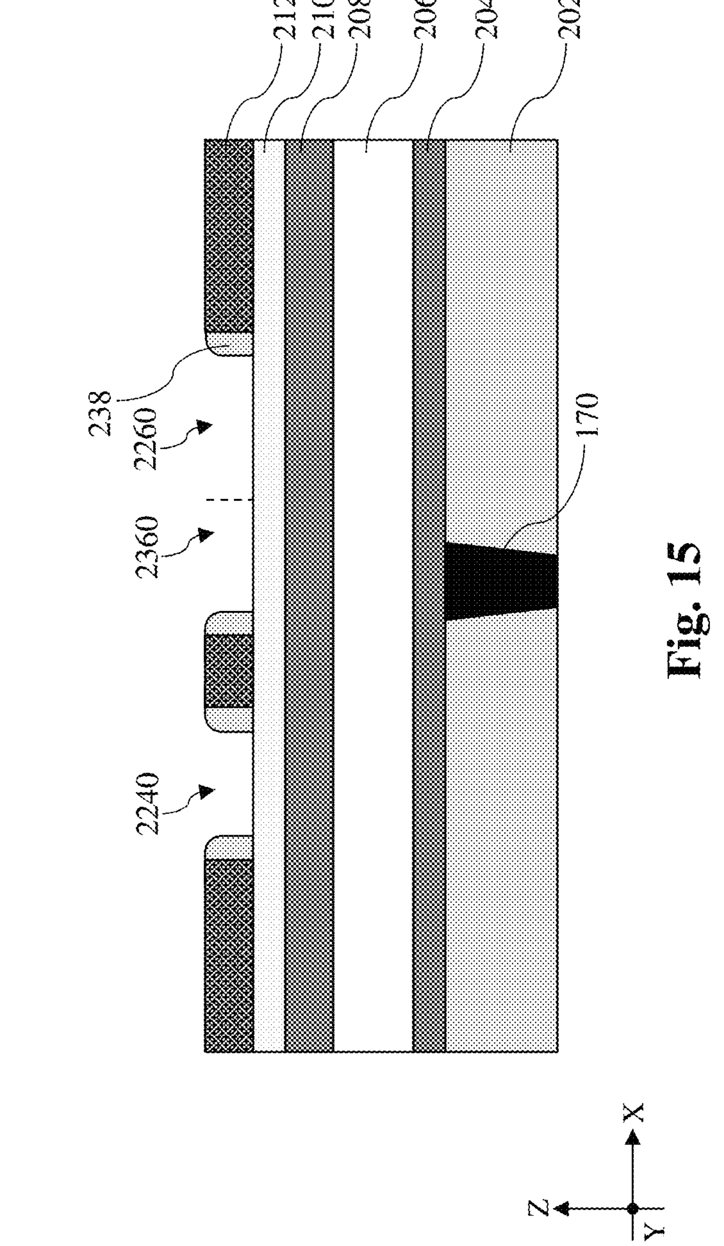

Referring to FIGS. 1, 14 and 15, method 100 includes a block 114 where a spacer 238 is formed along sidewalls of the silicon layer 212. FIG. 14 includes a fragmentary top view of the workpiece 200 while FIG. 15 illustrates a fragmentary cross-sectional view of the workpiece 200 in FIG. 14 along section I-I'. At block 114, the spacer 238 is formed along sidewalls of the third trench 224, the fourth trench 226, and the branch opening 236. In an example process, a spacer material is conformally deposited over the workpiece 200, including over the surfaces of the silicon layer 212, the third trench 224, the fourth trench 226, the branch opening 236, and the exposed second hard mask layer 210. The deposition of the spacer material may be performed using CVD or PECVD. The deposited spacer material layer is anisotropically etched to remove the spacer material from top-facing surfaces and to form the spacer 238 shown in FIGS. 14 and 15. The spacer 238 includes a material different from silicon in the silicon layer 212. In some instances, the spacer 238 includes silicon oxide, silicon nitride, silicon oxynitride, silicon oxycarbonitride, or a suitable material. In some embodiments, the spacer 238 may have a thickness (measured from sidewalls of the silicon layer 212) between about 8 nm and about 12 nm. With the spacer 238 in place, the third trench 224 may be shrunken to a first line opening 2240, the fourth trench 226 may be shrunken to a second line opening 2260, and the branch opening 236 may be shrunken to a local interconnect opening 2360. The local interconnect opening 2360 remains in fluid communication with the second line opening 2260. As described above, when the second width W2 is below 25 nm, the spacer 238 may merge to completely fill the branch opening 236 and the local interconnect opening 2360 may not exist. As shown in FIGS. 14 and 15, the local interconnect opening 2360 overlaps the gate contact via 170 and the gate structure 160 along the Z direction.

Figure 16:
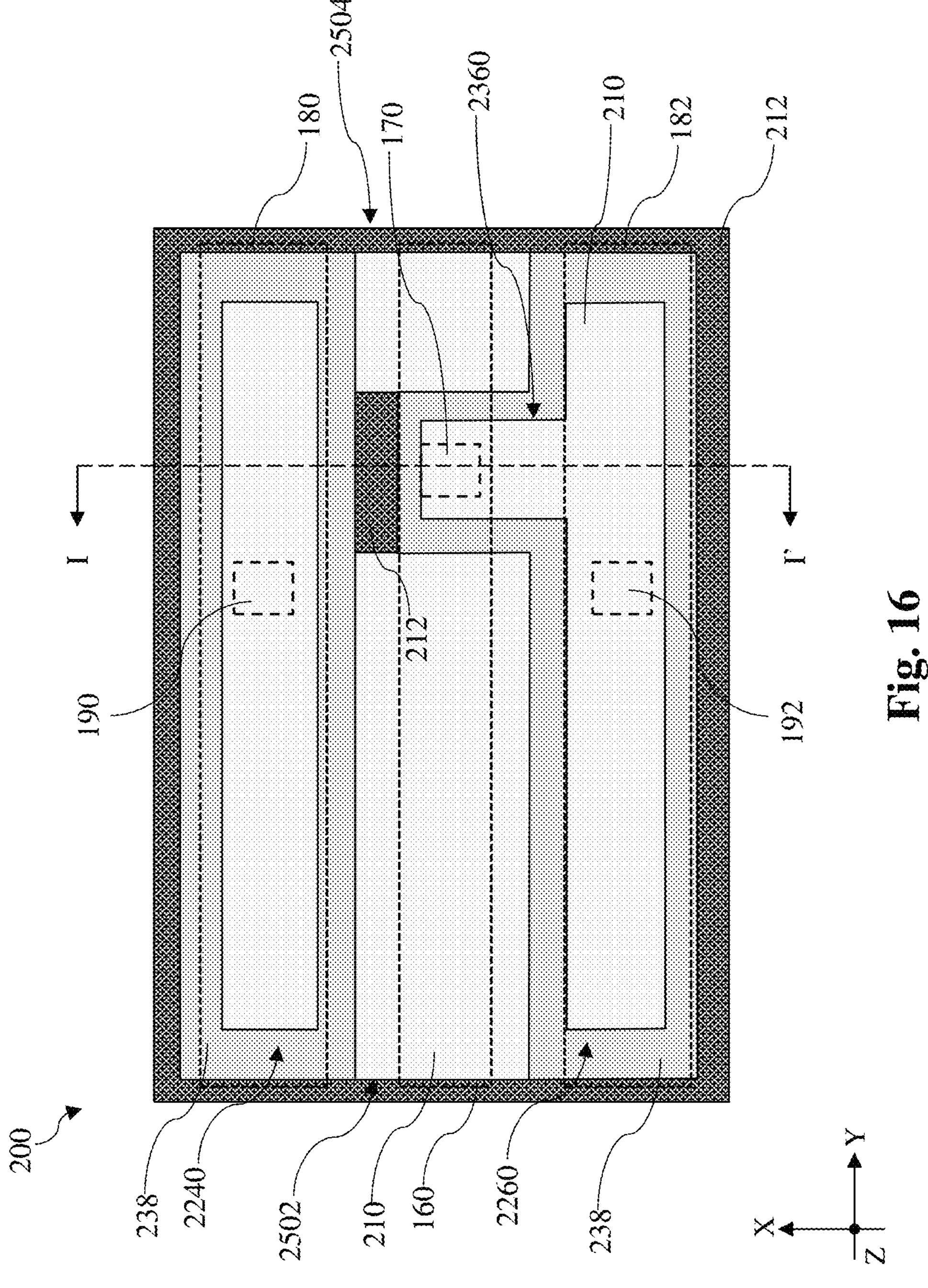
Figure 17:
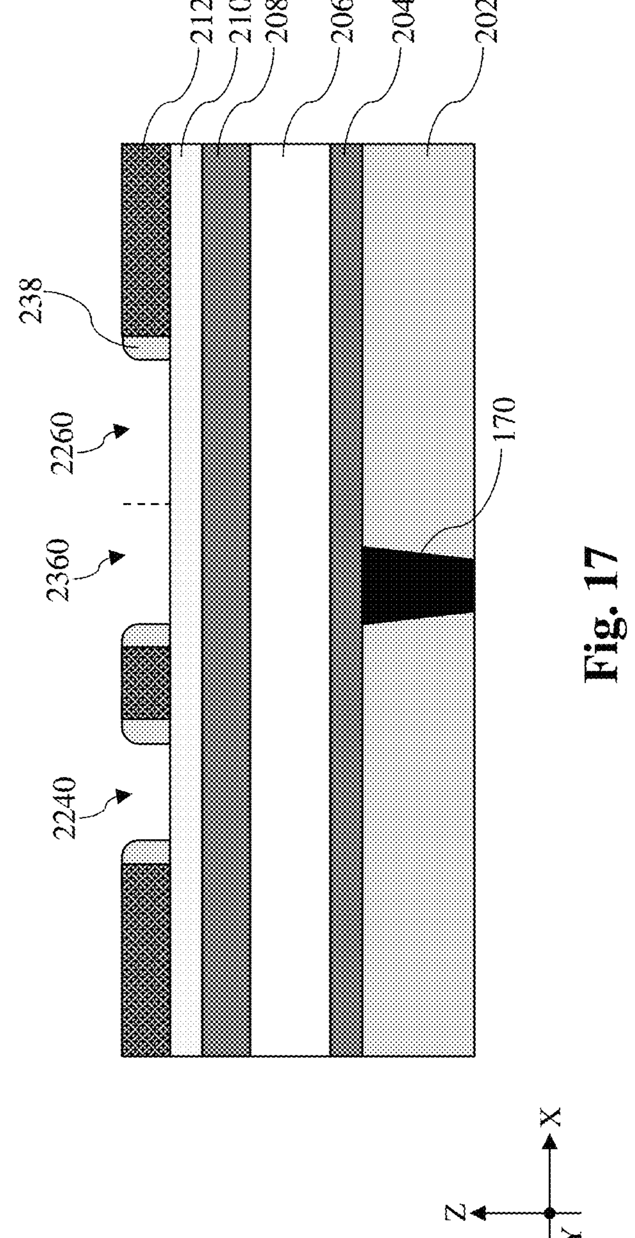

Referring to FIGS. 1, 16 and 17, method 100 includes a block 116 where the silicon layer 212 is patterned to form a first line trench 2502 and a second line trench 2504. FIG. 16 includes a fragmentary top view of the workpiece 200 while FIG. 17 illustrates a fragmentary cross-sectional view of the workpiece 200 in FIG. 16 along section I-I'. At block 116, photolithography processes and selective dry etch processes are used to define the first line trench 2502 and the second line trench 2504. In an example process, a photoresist layer and at least one hard mask (e.g. a tri-layer photoresist) may be deposited over the workpiece 200. The photoresist layer is then patterned to expose the areas over the first line trench 2502 and the second line trench 2504. The patterned photoresist layer is then used as an etch mask in the dry etch process that etches the hard mask layer to form a patterned hard mask. The patterned hard mask is applied as an etch mask in patterning the silicon layer 212 to form the first line trench 2502 and the second line trench 2504. It is noted that the patterned photoresist layer and the patterned hard mask at block 116 do not expose the portion of the silicon layer 212 between the local interconnect opening 2360 and the first line opening 2240. As a result, the first line trench 2502 is separated from the second line trench 2504, by this portion of silicon layer 212, the spacer 238 and the local interconnect opening 2360. Example dry etch processes are described above and will not be repeated again for brevity.

Figure 18:
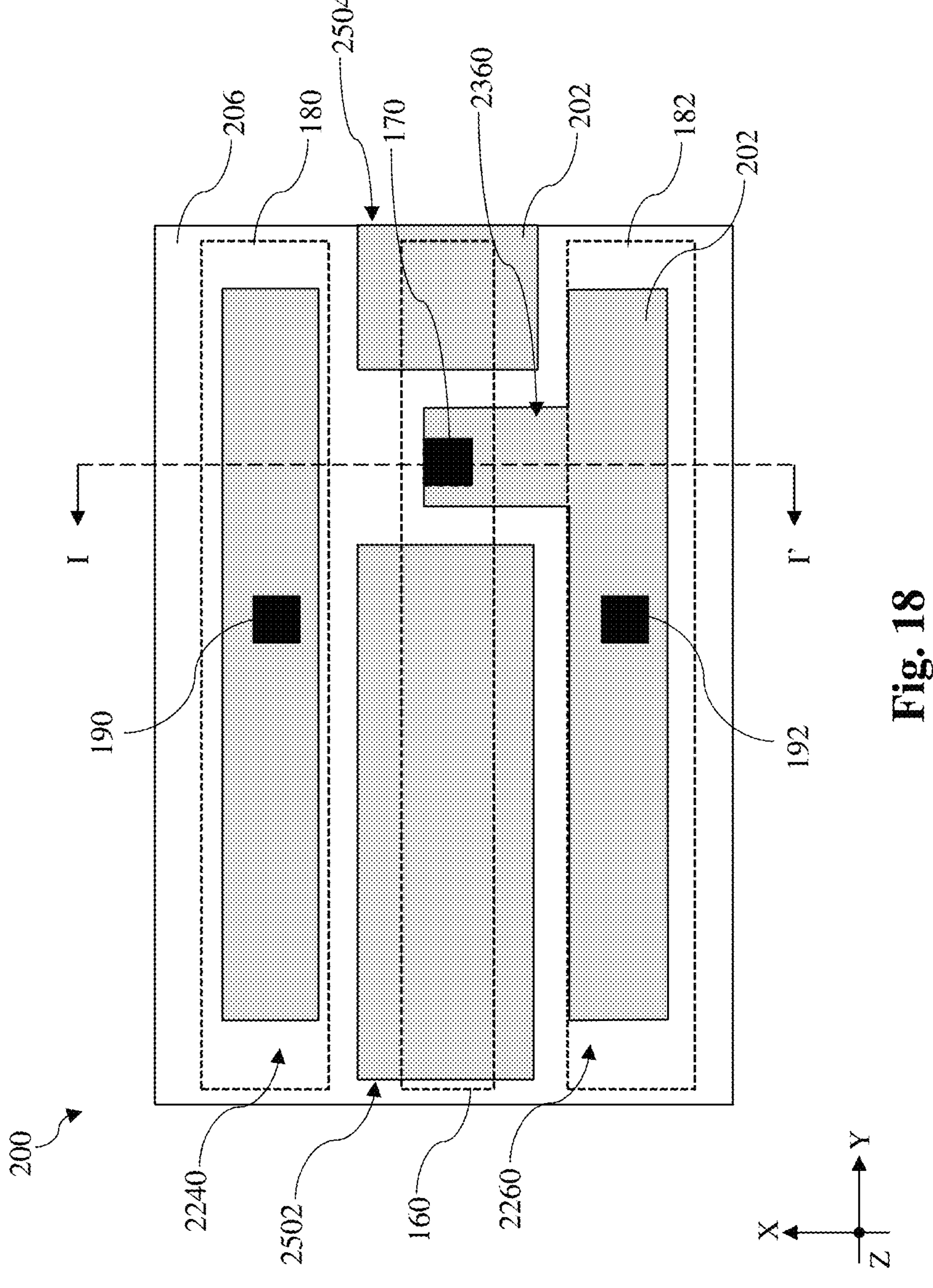

Referring to FIGS. 1, 18 and 19, method 100 includes a block 118 where the ESL 204 and the dielectric layer 206 are etched using the spacer 238 and the silicon layer 212 as an etch mask to form a first line opening 2240, a second line opening 2260, a first line trench 2502, the first line trench 2504, and a local interconnect opening 2360. FIG. 18 includes a fragmentary top view of the workpiece 200 while FIG. 19 illustrates a fragmentary cross-sectional view of the workpiece 200 in FIG. 18 along section I-I'. After the silicon layer 212 is patterned at block 116, the spacer 238 and the patterned silicon layer 212 are applied as an etch mask to etch the ESL 204 and the dielectric layer 206. The etch at block 118 may be a dry etch process that implements nitrogen, a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHB_3$), an iodine-containing gas, other suitable gases and/or plasmas, and/or combinations thereof. As shown in FIGS. 18 and 19, the first line opening 2240, the second line opening 2260, the local interconnect opening 2360, the first line trench 2502, and the second line trench 2504 are transferred to the ESL 204 and the dielectric layer 206. For ease of reference, the reference numerals for the first line opening 2240, the second line opening 2260, the local interconnect opening 2360, the first line trench 2502, and the second line trench 2504 remain unchanged after they are transferred to the ESL 204 and the dielectric layer 206.

Figure 20:
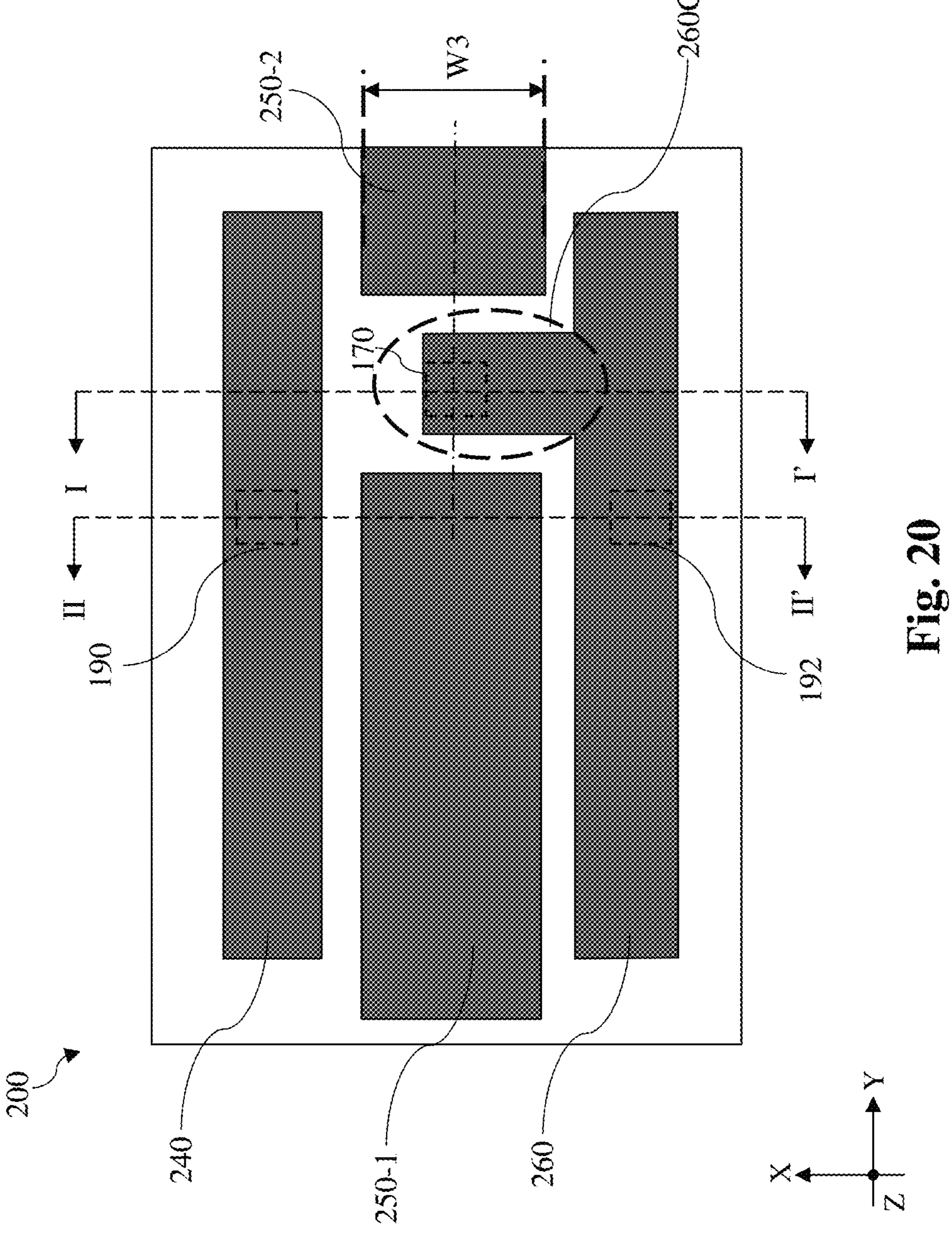
Figure 22:
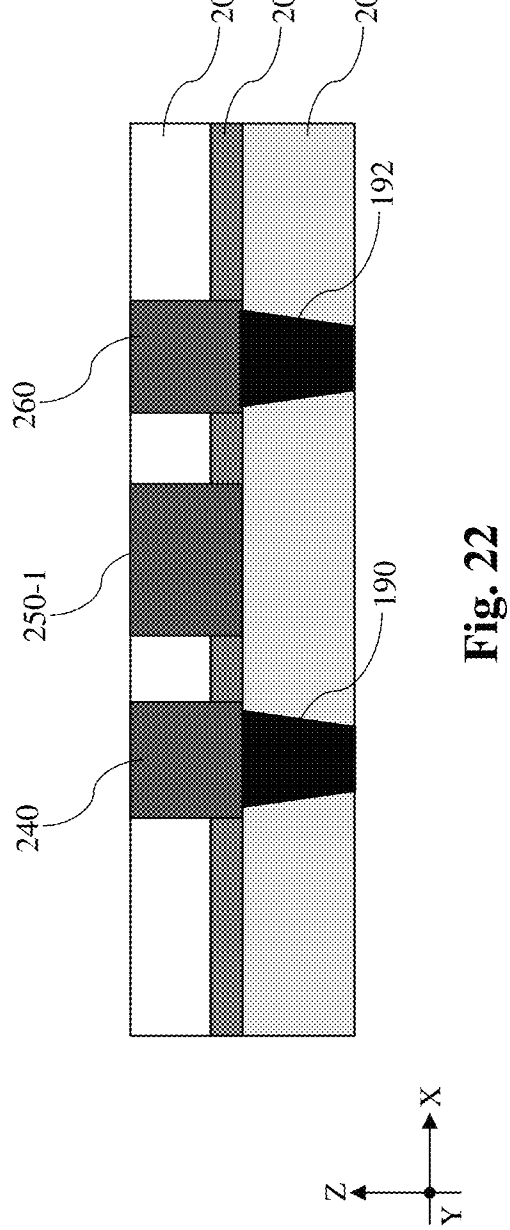

Referring to FIGS. 1, 20, 21 and 22, method 100 includes a block 120 where a first metal line 240, a second metal line 260, a first gate signal line segment 250-1, a second gate signal line segment 250-2, and a local interconnect 260C are formed respectively. FIG. 20 includes a fragmentary top view of the workpiece 200. FIG. 21 illustrates a fragmentary cross-sectional view of the workpiece 200 in FIG. 20 along section I-I'. FIG. 22 illustrates a fragmentary cross-sectional view of the workpiece 200 in FIG. 20 along section II-II'. At block 120, a metal is deposited over the first line opening 2240, the second line opening 2260, the local interconnect opening 2360, the first line trench 2502, and the second line trench 2504. After a planarization process is performed to remove excess metal from surfaces of the dielectric layer, the first metal line 240 is formed in the first line opening 2240, the second metal line 260 is formed in the second line opening 2260, the first gate signal line segment 250-1 is formed in the first line trench 2502, the second gate signal line segment 250-2 is formed in the second line trench 2504, and the local interconnect 260C is formed in the local interconnect opening 2360. The metal deposited at block 120 may include cobalt (Co), ruthenium (Ru), tungsten (W), copper (Cu), nickel (Ni), a combination thereof, or another suitable metal. In some embodiments, a barrier layer may be deposited over the first line opening 2240, the second line opening 2260, the local interconnect opening 2360, the first line trench 2502, and the second line trench 2504 before the deposition of the metal such that the metal lines and line segments are spaced apart from the dielectric layer 206. The barrier layer may include titanium nitride or tantalum nitride.

The first metal line 240, the second metal line 260, the first gate signal line segment 250-1, the second gate signal line segment 250-2 and the local interconnect 260C are in a metal layer, which is the first metal layer immediately over the first source/drain contact via 190, the second source/drain contact via 192, and the gate contact via 170. As shown in FIGS. 20 and 22, the first metal line 240 is disposed directly over and in electrical contact with the first source/drain contact via 190 and the second metal line 260 is disposed directly over and in electrical contact with the second source/drain contact via 192. As shown in FIGS. 20 and 21, and the local interconnect 260C is disposed directly over and in electrical contact with the gate contact via 170. Because the local interconnect 260C is continuous with the second metal line 260. Because the local interconnect 260C and the second metal line 260 are a continuous structure, they work together to locally interconnect the gate contact via 170 and the second source/drain contact via 192. The first gate signal line segment 250-1 and the second gate signal line segment 250-2 are lengthwise aligned along the Y direction. The first gate signal line segment 250-1 and the second gate signal line segment 250-2 are spaced apart from and isolated from the first metal line 240, the second metal line 260, and the local interconnect 260C. As shown in FIG. 20, each of the first gate signal line segment 250-1 and the second gate signal line segment 250-2 has a third width W3 along the X direction. The third width W3 may be between about 8 nm and about 35 nm. To ensure good ohmic contact between the local interconnect 260C and the gate contact via 170, the local interconnect 260C extends over at least one-half (½) of the third width W3 along the X direction. In FIG. 20, the local interconnect 260C extends across a middle line (shown in a dotdash line) of the first gate signal line segment 250-1 and the second gate signal line segment 250-2.

Further processes may be performed to form a complete interconnect structure. For example, a contact via may be formed over and in contact with the first metal line 240, another contact via may be formed over and in contact with the second metal line 260, yet another contact via may be formed over and in contact with the first gate signal line segment 250-1, and still another contact via may be formed over and in contact with the second signal line segment 250-2. With the local interconnect 260C to couple the gate contact via 170 and the second source/drain contact via 192, no additional photolithography processes may be needed to form any middle-end-of-line (MEOL) level local interconnect structure below the first metal layer.

In one exemplary aspect, the present disclosure is directed to a method. The method includes providing a workpiece having a substrate, an etch stop layer (ESL) over the substrate, a dielectric layer over the ESL, and a silicon layer over the dielectric layer, performing a first patterning process of the silicon layer to form a first trench and a second trench, performing a second patterning process of the silicon layer to form a branch opening in fluid opening with the second trench but is spaced apart from the first trench, forming a spacer along sidewalls of the first trench, the second trench and the branch opening, after the forming of the spacer, performing a third patterning process of the silicon layer to form a gate signal line trench between the first trench and the second trench, after the third patterning process of the silicon layer, etching the dielectric layer and the ESL using the silicon layer and the spacer as an etch mask, and depositing a metal layer over the dielectric layer and the ESL.

In some embodiments, the first trench, the second trench and the gate signal line trench extend along a first direction. The gate signal line trench includes a first segment and a second segment spaced apart from the first segment. In some embodiments, the branch opening extends along a second direction perpendicular to the first direction to interpose between the first segment and the second segment. In some implementations, the workpiece further includes a first source/drain contact via, a second source/drain contact via, and a gate contact via. The first trench is disposed directly over the first source/drain contact via. The second trench is disposed directly over the second source/drain contact via. The branch opening extends over the gate contact via. In some instances, the first source/drain contact via, the second source/drain contact via, and the gate contact via are not aligned along the second direction. In some embodiments, the first source/drain contact via is disposed over and in contact with a first source/drain contact that extends along the first direction, the second source/drain contact via is disposed over and in contact via a second source/drain contact that extends along the first direction, and the gate contact via is disposed over and in contact with a gate structure that extends along the first direction. In some embodiments, the workpiece further includes a first hard mask layer over the dielectric layer and a second hard mask layer over the first hard mask layer. The silicon layer is disposed on the second hard mask layer. In some instances, the second hard mask layer includes silicon nitride. A composition of the first hard mask layer is different from a composition of the second hard mask layer or a composition of the silicon layer.

In another exemplary aspect, the present disclosure is directed to a method. The method includes providing a workpiece including a substrate, a dielectric layer over the substrate, and a silicon layer over the dielectric layer, forming a first trench and a second trench in the silicon layer, wherein the first trench and the second trench extend along a first direction, forming a branch opening in the silicon layer, wherein the branch opening is in fluid communication with the second trench, conformally depositing a spacer material layer over the first trench, the second trench, and the branch opening, etching back the spacer material layer to form a spacer along sidewalls of the first trench, the second trench and the branch opening, after the etching back, selectively removing the silicon layer between the first trench and the second trench without substantially removing the spacer and the silicon layer between the branch opening and the first trench, after the selectively removing, transferring a pattern of the silicon layer and the spacer to the dielectric layer, and depositing a metal layer over the dielectric layer.

In some embodiments, the branch opening includes a width along the first direction. The spacer includes a thickness and the width is greater than two times of the thickness such that the spacer does not completely fill the branch opening. In some embodiments, the thickness is between about 8 nm and about 12 nm and the width is between about 25 nm and about 50 nm. In some implementations, the first trench is spaced apart from the second trench by a spacing, the branch opening includes, as measured from the second trench, a length along a second direction perpendicular to the first direction, and a ratio of the spacing to the length is between about 1.2 and about 1.6. In some instances, the spacing is between about 15 nm and about 30 nm.

In yet another exemplary aspect, the present disclosure is directed to a semiconductor structure. The semiconductor structure includes a first metal line extending along a first direction, a second metal line lengthwise aligned with and spaced apart from the first metal line, and a third metal line extending along the first direction. The third metal line includes a branch extending along a second direction perpendicular to the first direction and the branch partially extends between the first metal line and the second metal line.

In some embodiments, the first metal line and the second metal line include a width along the second direction and the branch extends along the second direction across more than one half (½) of the width. In some implementations, the semiconductor structure may further include a fourth metal line extending along the first direction. The first metal line is disposed between the third metal line and the fourth metal line and the branch is spaced apart from the fourth metal line. In some implementations, the first metal line, the second metal line, the third metal line, and the fourth metal line are embedded in an etch stop layer (ESL) and a dielectric layer over the ESL. In some embodiments, the third metal line is directly coupled to a drain contact via underlying the third metal line, the branch is directly coupled to a gate contact via underlying the branch, and the fourth metal line is directly coupled to a source contact via underlying the fourth metal line. In some instances, the branch is spaced apart from the first metal line. In some embodiments, the drain contact via, the gate contact via, and the source contact via are not aligned along the second direction.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
- a first source/drain contact and a second source/drain contact extending lengthwise along a first direction;
- a gate structure disposed between the first source/drain contact and the second source/drain contact along a second direction perpendicular to the first direction and extending lengthwise along the first direction; and
- a first metal layer disposed over the first source/drain contact, the second source/drain contact, and the gate structure, the first metal layer comprising:
  - a first metal line disposed over the first source/drain contact and extending along the first direction,
  - a first gate signal line and a second gate signal line disposed over the gate structure and spaced apart from one another by a gap along the first direction, and
  - a second metal line disposed over the second source/drain contact and extending along the first direction, wherein the second metal line comprises a branch that partially extends into the gap.

2. The semiconductor structure of claim 1, wherein each of the first metal line, the second metal line, the first gate signal line, and the second gate signal line comprises a barrier layer and a metal fill layer over the barrier layer.

3. The semiconductor structure of claim 2,
- wherein the barrier layer comprises titanium nitride or tantalum nitride,
- wherein the metal fill layer comprises cobalt (Co), ruthenium (Ru), tungsten (W), copper (Cu), nickel (Ni), or a combination thereof.

4. The semiconductor structure of claim 1, further comprising:
- a first source/drain contact via extending vertically between the first source/drain contact and the first metal line;
- a second source/drain contact via extending vertically between the second source/drain contact and the second metal line; and
- a gate contact via extending vertically between the gate structure and the branch of the second metal line.

5. The semiconductor structure of claim 1, wherein the first metal line, the second metal line, the first gate signal line, and the second gate signal line are disposed in an etch stop layer (ESL) and a dielectric layer disposed over the ESL.

6. The semiconductor structure of claim 1,
- wherein the gap comprises a width along the first direction,
- wherein the width is between about 25 nm and about 50 nm.

7. The semiconductor structure of claim 1, wherein the first gate signal line and the second gate signal line are aligned along the first direction.

8. The semiconductor structure of claim 1,
- wherein the first gate signal line and the second gate signal line comprise a width along the second direction,
- Wherein the width is between about 8 nm and about 35 nm.

9. A semiconductor structure, comprising:
- a source/drain contact extending lengthwise along a first direction;
- a gate structure adjacent the source/drain contact along a second direction perpendicular to the first direction and extending lengthwise along the first direction;
- an etch stop layer (ESL) over the source/drain contact and the gate structure;
- a dielectric layer over the ESL;
- a first gate signal line and a second gate signal line disposed over the gate structure and spaced apart from one another by a gap along the first direction; and
- a metal line disposed over the source/drain contact and extending along the first direction,
- wherein the metal line comprises a branch that partially extends into the gap.

10. The semiconductor structure of claim 9, wherein the metal line is electrically coupled to the source/drain contact by way of a source/drain contact via that extends vertically between the source/drain contact and the metal line.

11. The semiconductor structure of claim 10, wherein the branch of the metal line is electrically coupled to the gate structure by way of a gate contact via that extends vertically between the gate structure and the branch.

12. The semiconductor structure of claim 11, wherein the source/drain contact via and the gate contact via are not aligned along the second direction.

13. The semiconductor structure of claim 10,
- wherein the first gate signal line and the second gate signal line comprise a width along the second direction,
- wherein the branch extends along the second direction across more than one half (½) of the width.

14. A semiconductor structure, comprising:
- a first gate signal line extending along a first direction;
- a second gate signal line lengthwise aligned with and spaced apart from the first gate signal line; and
- a first metal line extending along the first direction,
- wherein the first metal line comprises a branch extending from the first metal line along a second direction perpendicular to the first direction,
- wherein the branch partially extends between the first gate signal line and the second gate signal line along the first direction.

15. The semiconductor structure of claim 14,
- wherein the first gate signal line and the second gate signal line comprise a width along the second direction,
- wherein the branch extends along the second direction across more than one half (½) of the width.

16. The semiconductor structure of claim 14, further comprising:
- a second metal line extending along the first direction,
- wherein the first gate signal line is disposed between the first metal line and the second metal line,
- wherein the branch is spaced apart from the second metal line.

17. The semiconductor structure of claim 16, wherein the first gate signal line, the second gate signal line, the first metal line, and the second metal line are embedded in an etch stop layer (ESL) and a dielectric layer over the ESL.

18. The semiconductor structure of claim 16,
- wherein the first metal line is directly coupled to a drain contact via underlying the first metal line,
- wherein the branch is directly coupled to a gate contact via underlying the branch,
- wherein the second metal line is directly coupled to a source contact via underlying the second metal line.

19. The semiconductor structure of claim 18, wherein the branch is spaced apart from the first gate signal line and the second gate signal line.

20. The semiconductor structure of claim 18, wherein the drain contact via, the gate contact via, and the source contact via are not aligned along the second direction.

* * * * *